(12) United States Patent
Kajigaya et al.

(10) Patent No.: US 8,988,958 B2
(45) Date of Patent: Mar. 24, 2015

(54) SENSE AMPLIFIER CIRCUIT AND SEMICONDUCTOR DEVICE

(71) Applicants: Kazuhiko Kajigaya, Tokyo (JP); Soichiro Yoshida, Tokyo (JP); Yasutoshi Yamada, Tokyo (JP)

(72) Inventors: Kazuhiko Kajigaya, Tokyo (JP); Soichiro Yoshida, Tokyo (JP); Yasutoshi Yamada, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/306,293

(22) Filed: Jun. 17, 2014

(65) Prior Publication Data

US 2014/0293721 A1 Oct. 2, 2014

Related U.S. Application Data

(63) Continuation of application No. 13/675,431, filed on Nov. 13, 2012, which is a continuation of application No. 13/666,177, filed on Nov. 1, 2012, which is a continuation of application No. 12/882,789, filed on Sep. 15, 2010, now Pat. No. 8,320,208.

(30) Foreign Application Priority Data

Sep. 16, 2009 (JP) .................. 2009-215045

(51) Int. Cl.
*G11C 7/00* (2006.01)
*G11C 7/06* (2006.01)
*G11C 11/4091* (2006.01)
*G11C 5/14* (2006.01)
*G11C 7/10* (2006.01)

(52) U.S. Cl.
CPC *G11C 7/06* (2013.01); *G11C 7/065* (2013.01); *G11C 7/067* (2013.01); *G11C 11/4091* (2013.01); *G11C 5/147* (2013.01); *G11C 7/1087* (2013.01)
USPC ............................. 365/203; 365/205; 365/207

(58) Field of Classification Search
CPC ...... G11C 11/4091; G11C 7/065; G11C 7/08; G11C 2207/002; G11C 7/12; G11C 11/4094; G11C 7/00; G11C 7/02
USPC ................. 365/203, 205, 207, 148, 149, 196, 365/189.2, 189.08, 189.09
See application file for complete search history.

(56) References Cited

U.S. PATENT DOCUMENTS

| 8,068,369 | B2 | 11/2011 | Kajigaya | |
|---|---|---|---|---|
| 8,072,828 | B2* | 12/2011 | Kajigaya | ........................ 365/207 |
| 8,422,316 | B2 | 4/2013 | Kajigaya | |
| 8,588,019 | B2* | 11/2013 | Kajigaya | ........................ 365/203 |
| 2002/0105831 | A1* | 8/2002 | Lee et al. | ................. 365/185.21 |
| 2009/0257268 | A1* | 10/2009 | Kajigaya | ........................ 365/148 |
| 2010/0054065 | A1 | 3/2010 | Kajigaya | |
| 2011/0188325 | A1 | 8/2011 | Kajigaya | |

FOREIGN PATENT DOCUMENTS

| JP | 2010-055729 A | 3/2010 |
|---|---|---|
| JP | 2011-159365 A | 8/2011 |

* cited by examiner

*Primary Examiner* — Hien Nguyen
(74) *Attorney, Agent, or Firm* — Sughrue Mion, PLLC

(57) ABSTRACT

A single-ended sense amplifier circuit of the invention comprises first and second MOS transistors and first and second precharge circuits. The first MOS transistor drives the bit line to a predetermined voltage and switches connection between the bit line and a sense node and the second MOS transistor whose gate is connected to the sense node amplifies the signal via the first MOS transistor. The first precharge circuit precharges the bit line to a first potential and the second precharge circuit precharges the sense node to a second potential. Before sensing operation, the bit line is driven to the predetermined voltage when the above gate voltage is controlled to decrease. The predetermined voltage is appropriately set so that a required voltage difference at the sense node between high and low levels can be obtained near a changing point between charge transfer/distributing modes.

10 Claims, 29 Drawing Sheets

SENSE AMPLIFIER CIRCUIT AND SEMICONDUCTOR DEVICE

This application is a Continuation Application of U.S. application Ser. No. 13/675,431 filed Nov. 13, 2012 which is a continuation of application Ser. No. 13/666,177 filed Nov. 1, 2012, which is a continuation of application Ser. No. 12/882,789 filed Sep. 15, 2010, which claims the benefit of priority to Japanese Patent Application No. 2009-215045 filed Sep. 16, 2009, the disclosures of which are incorporated by reference in their entirety.

BACKGROUND OF THE INVENTION

1. Field of the Invention

The present invention relates to a single-ended sense amplifier circuit amplifying a signal read out from a memory cell and transmitted through a bit line, and to a semiconductor device having the single-ended amplifier circuit.

2. Description of Related Art

As capacity of semiconductor memory devices such as a DRAM has recently become large, it has become difficult to obtain a sufficient capacitance value of a capacitor included in a memory cell for the purpose of miniaturization of the memory cell. A charge transfer type sense amplifier circuit is conventionally known as a sense amplifier circuit suitable for amplifying a minute signal voltage read out from the memory cell. For example, configurations of a variety of charge transfer type sense amplifiers are disclosed in the following Patent References 1 to 4.

Patent Reference 1: Japanese Patent Application Laid-open No. 2000-195268
Patent Reference 2: Japanese Patent Application Laid-open No. 2002-157885
Patent Reference 3: Japanese Patent Application Laid-open No. H11-16384
Patent Reference 4: Japanese Patent Application Laid-open No. 2007-73121

FIG. 29 shows a configuration example of a conventional typical charge transfer type sense amplifier circuit. In FIG. 29, there are shown a memory cell MC composed of an N-type selection transistor Q0 and a capacitor Cs, two N-type MOS transistors Qg and Qp, and a latch type differential amplifier 100. The selection transistor Q0 has a source connected to a bit line BL, and a gate connected to a word line WL. The capacitor Cs is connected between the drain of the selection transistor Q0 and a ground potential. The MOS transistor Qg switches connection between the bit line BL and a sense node Ns in response to a gate voltage Vg. The MOS transistor Qp switches connection between a power supply voltage VDD and the sense node Ns in response to a control signal SET applied to the gate of the MOS transistor Qp. The latch type differential amplifier 100 receives a signal voltage at the sense node Ns and a reference voltage Vr respectively, and amplifies a difference therebetween and latches it. In addition, the reference voltage Vr is set to an intermediate voltage of the both voltages at the sense node Ns in reading out high-level and low-level data from the memory cell MC.

In FIG. 29, a bit line capacitance Cb is formed at the bit line BL and a capacitance Ca is formed at the sense node Ns. It has been found from the study of the inventors that operation modes assumed in a sense amplifier circuit are determined depending on parameters such as the capacitance Cs of the capacitor, the potential of the bit line BL and the bit line capacitance Cb, and the potential of the sense node Ns and the capacitance Ca (refer to FIG. 1 and description thereof), and that the sense amplifier circuit is operated in accordance with later-mentioned formulas 1 to 3. It has been confirmed that a charge transfer mode is dominant in the conventional charge transfer type sense amplifier circuit shown in FIG. 29 among the above-mentioned operation modes.

However, when using the charge transfer type sense amplifier circuit of FIG. 29, it is inevitable that the capacitance Ca at the sense node Ns increases since the large-scale latch type differential amplifier 100 is employed. For example, in a configuration including 512 memory cells MC on one bit line BL, it is assumed that the capacitance Ca=10 fF at the sense node Ns is obtained for the bit line capacitance Cb=50 fF. As a result of the study of the inventors under such a condition, it has been found that the amplifying operation of the sense amplifier circuit is not hindered when the power supply voltage VDD is relatively high (for example, 3V or 2V), however, the amplifying operation is hindered when lowering the power supply voltage VDD, for example, an operation under VDD=1V (refer to FIGS. 6 and 7 and descriptions thereof). Under this condition, the voltage difference at the sense node Ns in reading out high-level and low-level data from the memory cell MC becomes reduced, and sufficient operating margin cannot be obtained. Further, it has been found that such a tendency becomes further pronounced when using the capacitor Cs having a smaller capacitance to miniaturize the memory cell MC. As described above, the conventional charge transfer type sense amplifier circuit has a problem in that it is difficult to apply to the configuration achieving the lower voltage operation using memory cells MC having a small capacitance.

SUMMARY

The present invention seeks to solve one or more of the above problems and provides a sense amplifier circuit capable of obtaining sufficient operating margin and sufficient operating speed in a read operation by appropriately controlling amplifying operations in a charge transfer mode and in a charge distributing mode, in case of achieving low voltage operation in a semiconductor device employing memory cells each including a capacitor having a small capacitance.

An aspect of the invention is a sense amplifier circuit of a single-ended type amplifying a signal which is read out from a memory cell and is transmitted through a bit line, comprising: a first MOS transistor driving the bit line to a predetermined voltage and switching connection between the bit line and a sense node in response to a gate voltage; a second MOS transistor having a gate connected to the sense node and amplifying the signal transmitted from the bit line via the first MOS transistor; a first precharge circuit precharging the bit line to a first potential in response to a first control signal; and a second precharge circuit precharging the sense node to a second potential higher than the first potential in response to a second control signal. In the sense amplifier circuit of the invention, before a sensing operation, the gate voltage is set to a second voltage in a predetermined period in a state where the bit line is maintained at the first potential, and thereafter the bit line is driven to the predetermined voltage by setting the gate voltage to a first voltage lower than the second voltage in a state where the sense node is maintained at the second potential, and the predetermined voltage is set to a value such that a required voltage difference at the sense node between high-level data and low-level data read out from the memory cell can be obtained in a vicinity of a changing point between a charge transfer mode and a charge distributing mode within a range of a read voltage of the memory cell.

According to the sense amplifier circuit of this aspect, in a read operation of the memory cell, during the voltage setting of the bit line and the sense node, the first MOS transistor functions as a charge transfer gate by overdriving the gate voltage thereof, and the second MOS transistor amplifies the signal voltage based on the charge transfer mode and the charge distributing mode. At this point, the predetermined voltage supplied to the bit line is set to a value such that the voltage difference between the high-level data and low-level data which are read from the memory cell can be obtained sufficiently. Therefore, since the single-ended type is employed, the capacitance at the sense node can be small, and if a memory cell with a low capacitance is employed, it is possible to achieve a configuration effective for improving operating margin and operating speed particularly in a low-voltage operation.

Further, an aspect of the invention is a sense amplifier circuit of a single-ended type amplifying a signal which is read out from a memory cell and is transmitted through a bit line, comprising: a first MOS transistor switching connection between the bit line and a sense node in response to a gate voltage; a second MOS transistor having a gate connected to the sense node and amplifying the signal transmitted from the bit line via the first MOS transistor; a first precharge circuit precharging the bit line to a predetermined voltage in response to a first control signal; and a second precharge circuit precharging the sense node to a second potential higher than the predetermined voltage in response to a second control signal. In the sense amplifier circuit of the invention, before a sensing operation, the first MOS transistor is controlled to be conductive in a state where the bit line is maintained at the predetermined voltage and the sense node is maintained at the second potential, and the predetermined voltage is set to a value such that a required voltage difference at the sense node between high-level data and low-level data read out from the memory cell can be obtained in a vicinity of a changing point between a charge transfer mode and a charge distributing mode within a range of a read voltage of the memory cell.

According to the sense amplifier circuit of this aspect, in a read operation of the memory cell, the predetermined voltage is previously supplied to the bit line during the voltage setting of the bit line and the sense node, the first MOS transistor is controlled to be conductive so as to function as a charge transfer gate, and the second MOS transistor amplifies the signal voltage based on the charge transfer mode and the charge distributing mode. At this point, the predetermined voltage supplied to the bit line is set to a value such that the voltage difference between the high-level data and low-level data which are read from the memory cell can be obtained sufficiently. Therefore, since the single-ended type is employed, the capacitance at the sense node can be small, and if a memory cell with a low capacitance is employed, it is possible to achieve a configuration effective for improving operating margin and operating speed, particularly in a low-voltage operation.

Particularly the sense amplifier circuit of the invention is effectively applied to a hierarchical memory cell array. That is, in a configuration in which a predetermined number of local bit lines are selectively connected to a global bit line via local sense amplifiers, the circuit scale can be smaller by using the single-ended local sense amplifier without employing a differential configuration, and sufficient operating margin of the sense amplifier circuit can be obtained.

Further, particularly the sense amplifier circuit of the invention is effectively combined with a compensated voltage generating circuit generating a compensated voltage of which fluctuation of a threshold voltage of the first or second MOS transistor is compensated. By supplying such a compensated voltage to the sense amplifier circuit, the above-mentioned operating margin can be further improved.

As described above, according to the invention, when the single-ended sense amplifier is employed in which amplifying operation is controlled based on the charge transfer mode and the charge distributing mode, since the capacitance at the sense node can be small, sufficient operating margin in a low voltage operation of about 1V can be obtained. Particularly, an advantageous configuration can be achieved when using memory cells having a small capacitance of under about 5 fF.

In addition, by overdriving the gate voltage of the first MOS transistor, an operation of driving the bit line to the predetermined voltage can be performed in a short time before the sensing operation, and thus high-speed reading can be achieved.

Meanwhile, by previously driving the bit line to the predetermined voltage using the first precharge circuit, the sensing operation can be performed in a short time, and thus high-speed reading can be achieved.

Further, in a semiconductor device having a hierarchical bit line structure and a hierarchical sense amplifier circuit, the capacitance at each local bit line can be set to a small value, and therefore excellent operating margin can be obtained in the large capacity semiconductor device.

Furthermore, fluctuation of the threshold voltage of the MOS transistor due to manufacturing process and temperature can be appropriately compensated by using the compensated voltage generating circuit. Therefore, the operating margin for sensing can be further improved, thereby improving reliability of the operation of the sense amplifier circuit. Or, since the variation permissible range in the chip can be expanded, when large number of sense amplifier circuits can be implemented in a large capacity DRAM using memory cells each having a small capacitance, it is possible to improve production yield and to reduce manufacturing cost.

BRIEF DESCRIPTION OF THE DRAWINGS

The above featured and advantages of the invention will be more apparent from the following description of certain preferred embodiments taken in conjunction with the accompanying drawings, in which.

DETAILED DESCRIPTION OF THE PREFERRED EMBODIMENTS

Figure 3:
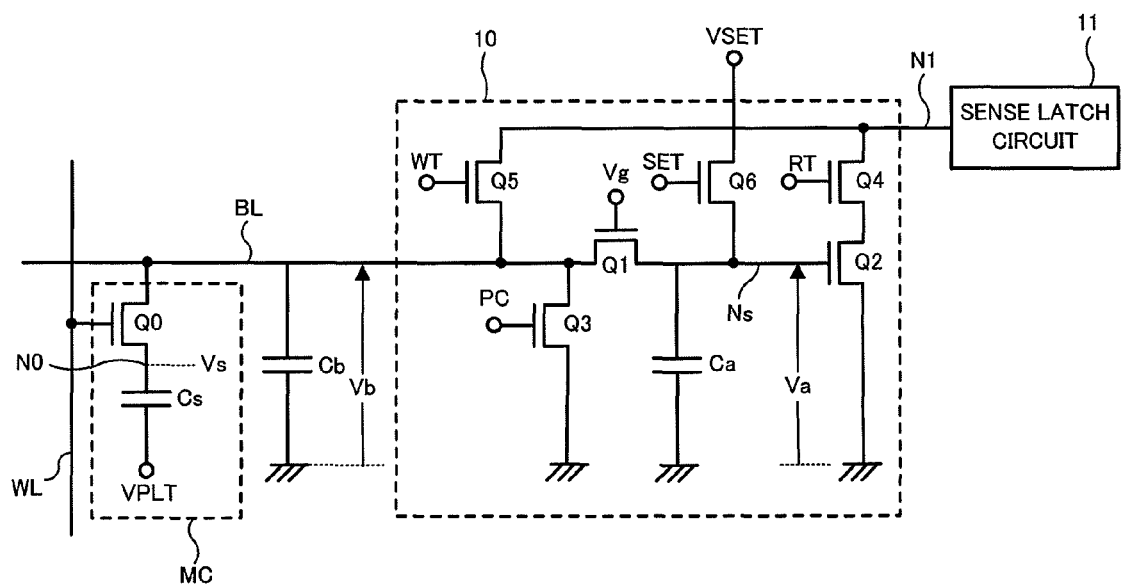
FIG. 3 is a diagram showing a configuration example of a sensing part in a DRAM of a first embodiment.
Figure 22:
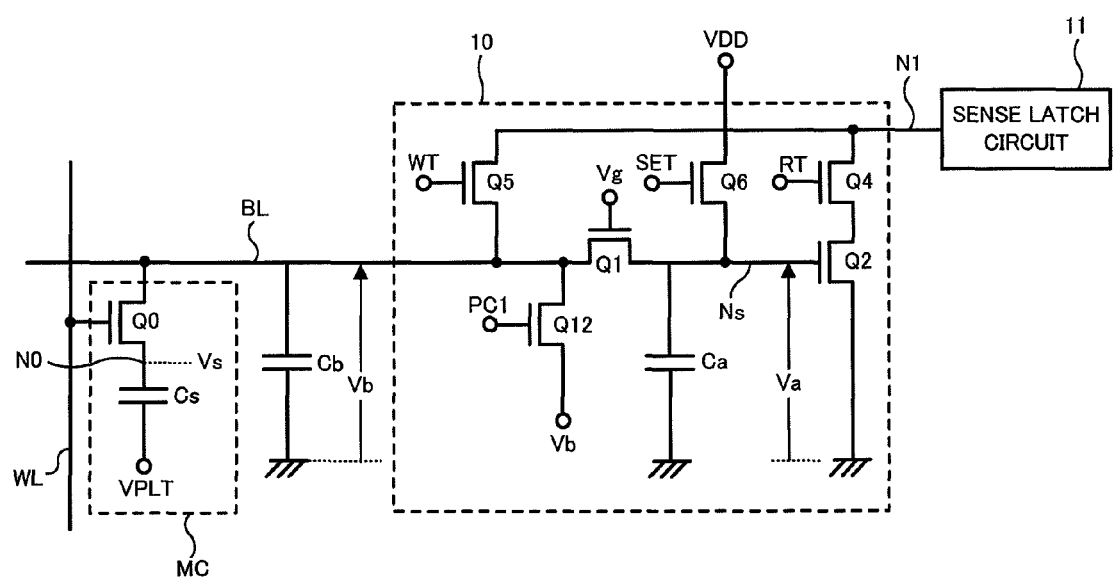
FIG. 22 is a diagram showing a configuration example of a sensing part in a DRAM of a fourth embodiment.

Typical examples of embodiments realizing a technical idea of the present invention will be shown. However, it goes without saying that the present invention is not limited to the examples of the embodiments and consists in the scope of the claimed invention. The following embodiments are applied to, for example, a single-ended sense amplifier circuit amplifying a signal which is read out from a memory cell (MC) and transmitted through a bit line (BL), as shown in FIGS. 3 and 22, in which a first MOS transistor (Q1), a second MOS transistor (Q2), a first precharge circuit (Q3 and Q12), and a second precharge circuit (Q6) are provided.

In one example of the embodiments, the first MOS transistor (Q1) drives the bit line (BL) to a predetermined voltage (Vb) and switches connection between the bit line (BL) and a sense node (Ns) in response to a gate voltage (Vg), and the second MOS transistor (Q2) has a gate connected to the sense node (Ns) and amplifies the signal transmitted from the bit line (BL) via the first MOS transistor (Q1). The first precharge circuit (Q3) precharges the bit line (BL) to a first potential (VSS) in response to a first control signal (PC), and the second precharge circuit (Q6) precharges the sense node (Ns) to a second potential (VSET) higher than the first potential (VSS) in response to a second control signal (SET). Then, before a sensing operation, the gate voltage (Vg) is set to the second voltage (Vg2) in a predetermined period in a state where the bit line (BL) is maintained at the first potential (VSS), and thereafter the bit line (BL) is driven to the predetermined voltage (Vb) by setting the gate voltage (Vg) to a first voltage (Vg1) lower than the second voltage (Vg2) in a state where the sense node (Ns) is maintained at the second potential (VSET).

In another example of the embodiments, the first MOS transistor (Q1) switches connection between the bit line (BL) and the sense node (Ns) in response to the gate voltage (Vg), and the second MOS transistor (Q2) has a gate connected to the sense node (Ns) and amplifies the signal transmitted from the bit line (BL) via the first MOS transistor (Q1). The first precharge circuit (Q12) precharges the bit line (BL) to the predetermined potential (Vb) in response to a first control signal (PC1), and the second precharge circuit (Q6) precharges the sense node (Ns) to a second potential (VDD) higher than the predetermined voltage (Vb) in response to the second control signal (SET). Then, before the sensing operation, the first MOS transistor (Q1) is controlled to be conductive in a state where the bit line (BL) is maintained at the predetermined voltage (Vb) and the sense node (Ns) is maintained at the second potential (VDD).

In the respective examples of the embodiments, the predetermined voltage (Vb) is set to a value such that a required voltage difference at the sense node (Ns) between high-level data and low-level data read out from the memory cell (MC) can be obtained in the vicinity of a changing point between the charge transfer mode and the charge distributing mode within a range of a read voltage of the memory cell (MC).

[Basic Principle]

Figure 1:
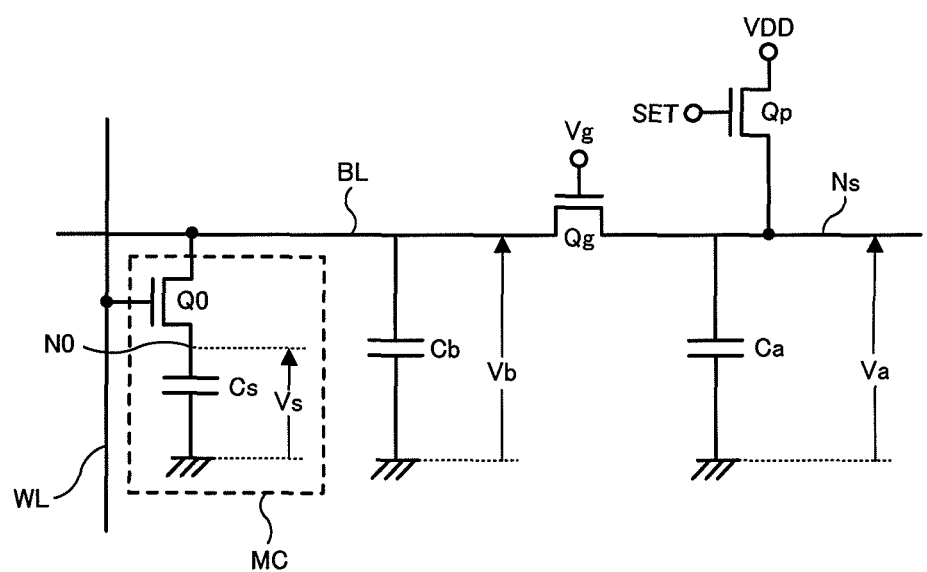
FIG. 1 is a diagram showing a first configuration example for explaining basic operating principle of a sense amplifier circuit of embodiments.

Basic operating principle of a sense amplifier circuit of the embodiments will be described with reference to FIGS. 1 and 2. In the following, a charge transfer mode and a charge distributing mode are mainly assumed as operation modes of the sense amplifier circuit. FIG. 1 schematically shows a first configuration example of an input side of the sense amplifier circuit operating in the charge transfer mode and the charge distributing mode. In FIG. 1, there are shown a memory cell MC composed of an N-type selection transistor Q0 and a capacitor Cs, and a sense amplifier circuit including two N-type MOS transistors Qg and Qp.

The selection transistor Q0 has a source connected to a bit line BL, and a gate connected to a word line WL. Further, the capacitor Cs is connected between the drain of the selection transistor Q0 and a ground potential. The MOS transistor Qg functioning as a charge transfer gate is connected between the bit line BL and a sense node Ns. The MOS transistor Qp for setting the potential of the sense node Ns is connected between a power supply voltage VDD and the sense node Ns. A gate voltage Vg is applied to the gate of the MOS transistor Qg, and a control signal SET is applied to the gate of the MOS transistor Qp. In FIG. 1, a bit line capacitance Cb formed at the bit line BL, a capacitance Ca formed at the sense node Ns, a voltage Vb at the bit line BL, and a voltage Va at the sense node Ns are respectively shown. Among these, the bit line capacitance Cb and the capacitance Ca at the sense node Ns are determined depending on parasitic capacitance of lines, input capacitance of transistors, the number of memory cells MC, and the like.

The sense node Ns is set to the power supply voltage VDD by the operation of the MOS transistor Qp before the sensing operation. At this point, the bit line BL is driven to the voltage Vb (the predetermined voltage of the invention) satisfying Vb=Vg−Vt1 via the MOS transistor Qg based on the gate voltage Vg and a threshold voltage Vt1 of the MOS transistor Qg.

Thereafter, the MOS transistor Qp is turned off, and subsequently the word line WL is driven so that the selection transistor Q0 is turned on. Thereby, the sensing operation of the sense amplifier circuit is started. When a voltage at a charge storage node N0 of the memory cell MC is assumed to be Vs, there can be following three operations in accordance with relations between values of Vs, Vb and VDD.
(1) The MOS transistor Qg is maintained off.
(2) Electric charge is transferred via the MOS transistor Qg in the above-mentioned charge transfer mode.
(3) Electric charge is transferred via the MOS transistor Qg in the above-mentioned charge distributing mode.

Here, the voltage Vb corresponding to a boundary (changing point) between the operation (2) and the operation (3) is defined as Vc. By using this voltage Vc, the voltage Va at the sense node Ns after the above operation is completed can be represented as following formulas 1, 2 and 3 respectively corresponding to the operations (1), (2) and (3).

$$Vb \leq Vs: Va=VDD \quad \text{(formula 1)}$$

$$Vs<Vb \leq Vc: Va=VDD+(Cs/Ca)Vs-(Cs/Ca)Vb \quad \text{(formula 2)}$$

$$Vc<Vb: Va=(CsVs+CaVDD)/(Cs+Cb+Ca)+(Cb/(Cs+Cb+Ca))Vb \quad \text{(formula 3)}$$

Here, the voltage Vc is calculated according to a following equation.

$$Vc=((Cs+Cb)CaVDD)+(Cs+Cb)CsVs)/(Cs(Cs+Cb+Ca)+CbCa)$$

Figure 29:
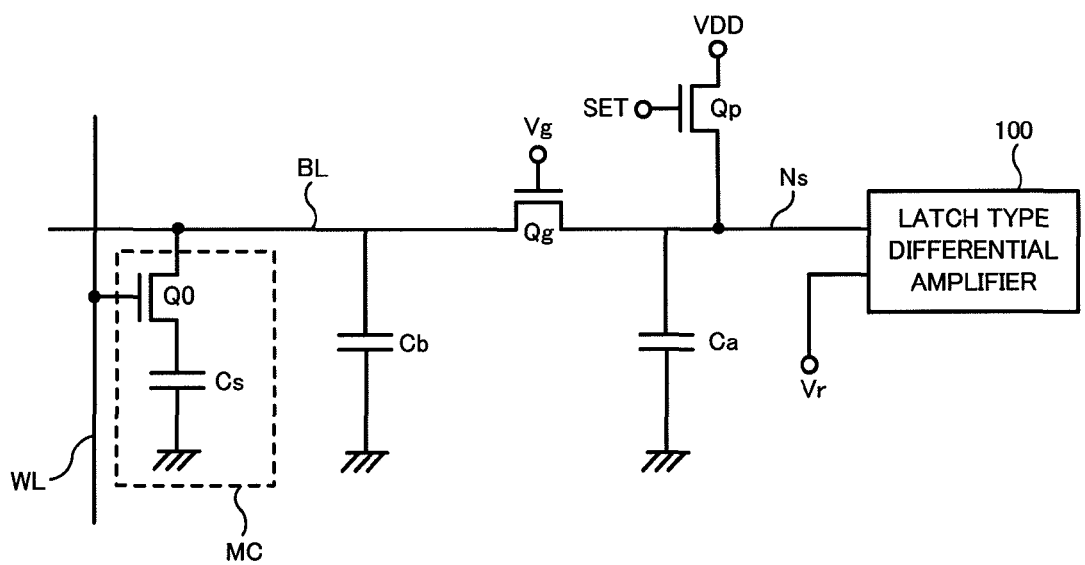
FIG. 29 is a diagram showing a configuration example of a conventional typical charge transfer type sense amplifier circuit.

For example, the conventional sense amplifier shown in FIG. 29 is mainly operated in the charge transfer mode of the above formula 2, which corresponds to a charge transfer type sense amplifier. However, the sense amplifier circuit of the embodiments has a feature of being operated by controlling both the charge transfer mode and the charge distributing mode.

Figure 2:
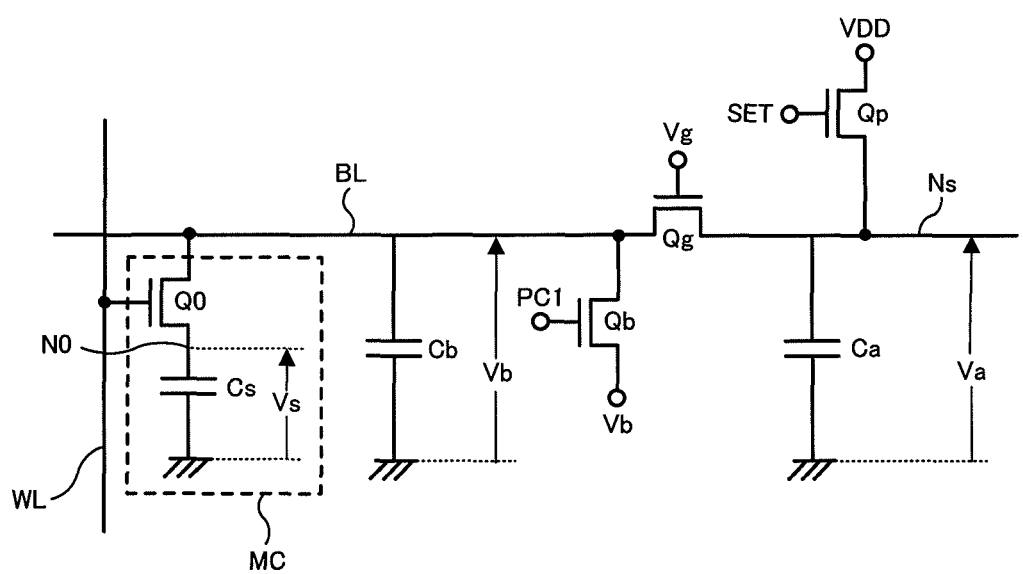
FIG. 2 is a diagram showing a second configuration example for explaining basic operating principle of a sense amplifier circuit of embodiments.

Meanwhile, FIG. 2 schematically shows a second configuration example of the input side of the sense amplifier circuit operating in the charge transfer mode and the charge distributing mode. FIG. 2 differs from FIG. 1 in that an N-type MOS transistor Qb is provided in addition to the two MOS transistors Qg and Qp. The MOS transistor Qb is for setting the bit line potential and is connected between the bit line BL and the voltage Vb. A precharge signal PC1 is applied to the gate of the MOS transistor Qb. Here, other portions of FIG. 2 are configured in the same manner as in FIG. 1.

In the second configuration of FIG. 2, the bit line BL is previously set to the voltage Vb by controlling the MOS transistor Qb before the sensing operation. Operations thereafter are performed in the same manner as in FIG. 1, and the above operations (1), (2), (3) and the above formulas 1, 2, 3 can be applied in FIG. 2 in the same manner as in FIG. 1.

The following embodiments will be described under the assumption that the first configuration example of FIG. 1 is applied to the following first to third embodiments and the second configuration example of FIG. 2 is applied to the following fourth to six embodiments.

First Embodiment

A first embodiment of the invention will be described below. A feature of the first embodiment is that a single-ended sense amplifier circuit controlled in the charge transfer mode and the charge distributing mode is employed. FIG. 3 shows a configuration example of a sensing part in a DRAM of the first embodiment, in which a memory cell MC, a preamplifier 10 functioning as the above basic operation of the sense amplifier circuit, and a sense latch circuit 11 located subsequent to the preamplifier 10 are shown.

The memory cell MC is a 1T1C type DRAM memory cell composed of an N-type MOS selection transistor Q0, and a capacitor Cs storing information as electric charge. The selection transistor Q0 has a source connected to the bit line BL and a gate connected to the word line WL. The capacitor Cs is connected between the drain of the selection transistor Q0 and a cell plate voltage VPLT. Although FIG. 3 shows one memory cell MC, a large number of memory cells MC arranged at intersections of a plurality of word lines WL and a plurality of bit lines BL are practically provided. In the first embodiment, it is assumed that 512 memory cells MC, for example, are connected to one bit line BL. In this case, the bit line capacitance Cb totally formed at one bit line BL is, for example, 50 fF.

The preamplifier 10 includes six N-type MOS transistors Q1, Q2, Q3, Q4, Q5 and Q6. The MOS transistor Q1 (the first MOS transistor of the invention) functioning as the charge transfer gate is connected between the bit line BL and the sense node Ns in the preamplifier 10, and the gate voltage Vg is applied to its gate. The MOS transistor Q2 (the second MOS transistor of the invention) functioning as an amplifying element has a gate connected to the sense node Ns, and senses and amplifies the signal transmitted from the bit line BL via the MOS transistor Q1 so as to convert the signal into a drain current. The drain current flows from an input/output node N1 of the input side of the sense latch circuit 11 to the ground via the MOS transistors Q4 and Q2.

A precharge signal PC is applied to the gate of the MOS transistor Q3 (the first precharge circuit of the invention) functioning as a transistor for precharging the bit line BL, and the MOS transistor Q3 precharges the bit line BL to a ground potential VSS when the precharge signal PC is high. The MOS transistor Q4 for read control switches connection between the input/output node N1 and the MOS transistor Q2 in response to a control signal RT applied to the gate of the MOS transistor Q4. The MOS transistor Q5 for write control switches connection between the input/output output node N1 and the sense node Ns in response to a control signal WT applied to the gate of the MOS transistor Q5. The control signal SET is applied to the gate of the MOS transistor Q6 (the second precharge circuit of the invention) for setting the bit line potential and precharging the sense node Ns, and the MOS transistor Q6 precharges the sense node Ns to a positive voltage VSET when the control signal SET is high. In addition, the power supply voltage VDD connected to the source of the MOS transistor Qp in FIG. 1 is replaced with the positive voltage VSET, and "VDD" included in the above formulas 1 to 3 should be replaced with "VSET".

Since the preamplifier 10 has a simple configuration including six MOS transistor as shown in FIG. 3, the value of the capacitance Ca formed at the sense node Ns in the preamplifier 10 is, for example, 1 to 2 fF, which is much smaller than that of the bit line capacitance Cb.

Figure 4:
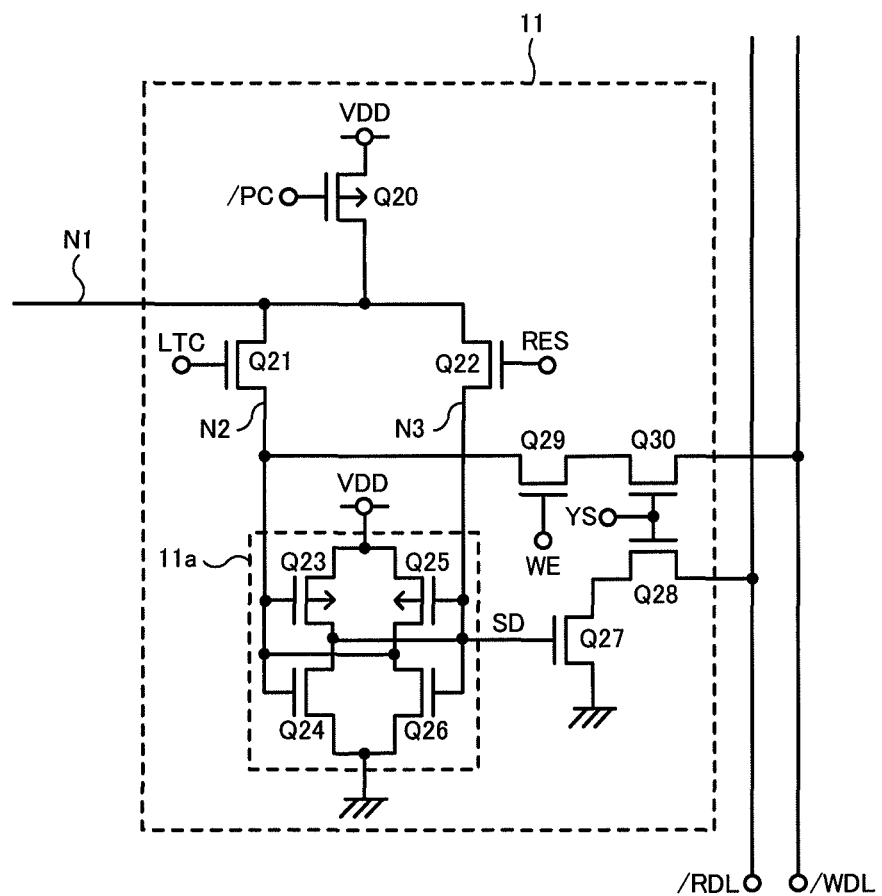
FIG. 4 is a diagram showing an example of a circuit configuration of a sense latch circuit of FIG. 3.

FIG. 4 shows an example of a circuit configuration of the sense latch circuit 11 subsequent to the preamplifier 10. As shown in FIG. 4, the input/output node N1, a read bus /RDL and a write bus /WDL are connected to the sense latch circuit 11, and the sense latch circuit 11 includes three P-type MOS transistors Q20, Q23 and Q25, and eight N-type MOS transistors Q21, Q22, Q24, Q26 to Q30. The MOS transistor Q20 for precharging is connected between the power supply voltage VDD and the input/output node N1. The MOS transistor Q20 precharges the input/output node N1 to the power supply voltage VDD when an inverted precharge signal /PC applied to the gate is low. The MOS transistor Q21 switches connection between the input/output node N1 and a node N2 in response to a control signal LTC applied to the gate. Further, the MOS transistor Q22 switches connection between the input/output node N1 and a node N3 in response to a control signal RES applied to the gate.

A signal voltage decision latch 11a includes MOS transistors Q23, Q24, Q25 and Q26, and determines a binary level of a signal transmitted from the preamplifier 10 to the input/output node N1 so as to latch the signal. In the signal voltage decision latch 11a, a pair of MOS transistors Q23 and Q24 having gates connected to the node N2 forms a sensing inverter having a relatively large driving force. Similarly, a pair of MOS transistors Q25 and Q26 having gates connected to the node N3 forms a latching inverter having a relatively small driving force.

Two MOS transistors Q27 and Q28 are connected in series as a read circuit between the read bus /RDL and the ground, and an output signal SD (node N3) of the signal voltage decision latch 11a is inputted to the gate of the MOS transistor Q27. Two MOS transistors Q29 and Q30 are connected in series as a write circuit between the write bus /WDL and the node N2, and a write enable signal WE is inputted to the gate of the MOS transistor Q29. A sense amplifier selection signal YS is commonly inputted to the gates of the MOS transistors Q28 and Q30.

In a read operation, the latch control signal LTC becomes high and the sense amplifier selection signal YS becomes high, and the output signal SD of the sensing inverter is outputted to the read bus /RDL. At this point, the output signal SD appearing at the node N3 has a voltage obtained by inverting the logic value at the input/output node N1. In a rewrite operation performed for avoiding destruction of data of memory cells MC after the read operation, the latch control signal LTC becomes low, the control signal RES becomes high, and the output signal SD is outputted to the input/output node N1 via the NMOS transistor Q22.

Meanwhile, in a write operation, the sense amplifier selection signal YS becomes high, the write enable signal WE becomes high, and write data is inputted through the write bus /WDL. The write data is inverted by the sensing inverter, and outputted to the input/output node N1 via the MOS transistor Q22.

Figure 5A:
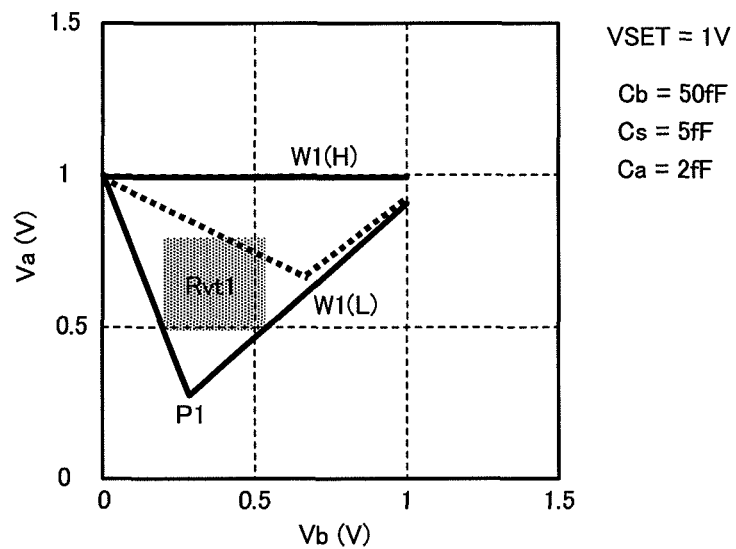
FIGS. 5A and 5B are diagrams for explaining an amplifying operation of the sense amplifier circuit of the first embodiment.
Figure 5B:
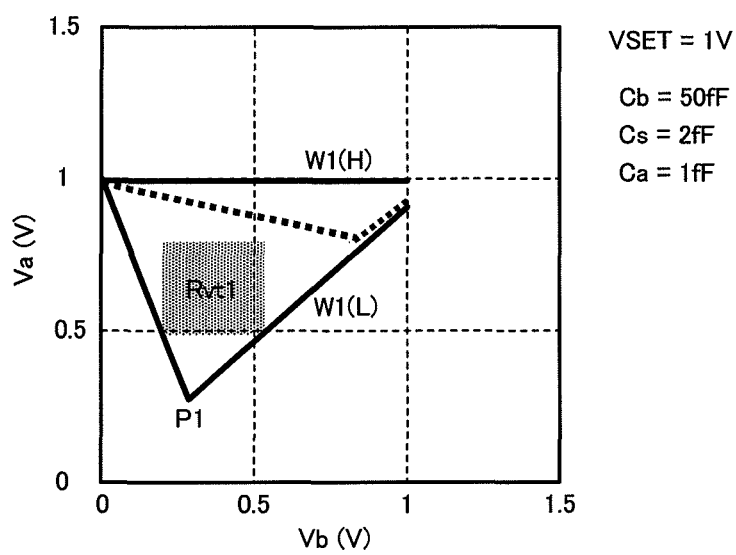

Next, an amplifying operation of the sense amplifier circuit of the first embodiment will be descried using FIGS. 5A and 5B. FIGS. 5A and 5B show two graphs corresponding to two conditions of capacitances for the purpose of explaining the amplifying operation of the sense amplifier circuit of the first embodiment. In each graph, VSET=1V is assumed, a characteristic W1 (H) represents a characteristic when reading high-level data from the memory cell MC (Vs=1V), and a characteristic W1 (L) represents a characteristic when reading low-level data from the memory cell MC (Vs=0V). In addition, the voltage Vs is a voltage of the capacitor Cs at the charge storage node N0. Further, regarding the bit line capacitance Cb, the capacitance of the capacitor Cs (Hereinafter referred to simply as "capacitance Cs") of the memory cell MC and the capacitance Ca at the sense node Ns, settings in FIG. 5A are Cb=50 fF, Cs=5 fF and Ca=2 fF, and settings in FIG. 5B are Cb=50 fF, Cs=2 fF and Ca=1fF.

In FIGS. 5A and 5B, since the positive voltage VSET is 1V in the characteristic W1 (H) of reading the high-level data, the voltage Va is maintained at 1V for a change in the voltage Vb in accordance with the above formula 1. Meanwhile, the characteristic W1 (L) of reading the low-level data is operated in the charge transfer mode in accordance with the above formula 2 before reaching a changing point P1 (left side of P1), and is operated in the charge distributing mode in accordance with the above formula 3 after passing the changing point P1 (right side of P1). In each graph, a range within which the signal voltage can be read out is determined by a voltage difference between the characteristics W1 (H) and W1 (L).

Each of FIGS. 5A and 5B also shows a setting example of a variation permissible range Rvt1 for the threshold voltage in the preamplifier 10. A width along a vertical axis of the variation permissible range Rvt1 indicates a variation permissible range of a threshold voltage Vt2 of the MOS transistor Q2, and a width along a horizontal axis of the variation permissible range Rvt1 indicates a variation permissible range of a threshold voltage Vt1 of the MOS transistor Q1. In addition, the voltage Vb is set to a voltage lower than the constant gate voltage Vg of the MOS transistor Q1 by the threshold voltage Vt1 of the MOS transistor Q1. In the examples of FIGS. 5A and 5B, the variation permissible range of the threshold voltage Vt2 of the MOS transistor Q2 is within 0.5 to 0.8V, and the width along the horizontal axis corresponding to the variation permissible range of the threshold voltage Vt1 of the MOS transistor Q1 is within 0.2 to 0.5V. It is a condition for a stable amplifying operation by the preamplifier 10 that the variation permissible range Rvt1 entirely exists within an area surrounded by the characteristics W1 (H) and W1 (L). In this case, the larger the variation permissible range Rvt1 in the area surrounded by the characteristics W1 (H) and W1 (L), the larger the operating margin so as to improve the reliability of the amplifying operation.

Figure 6:
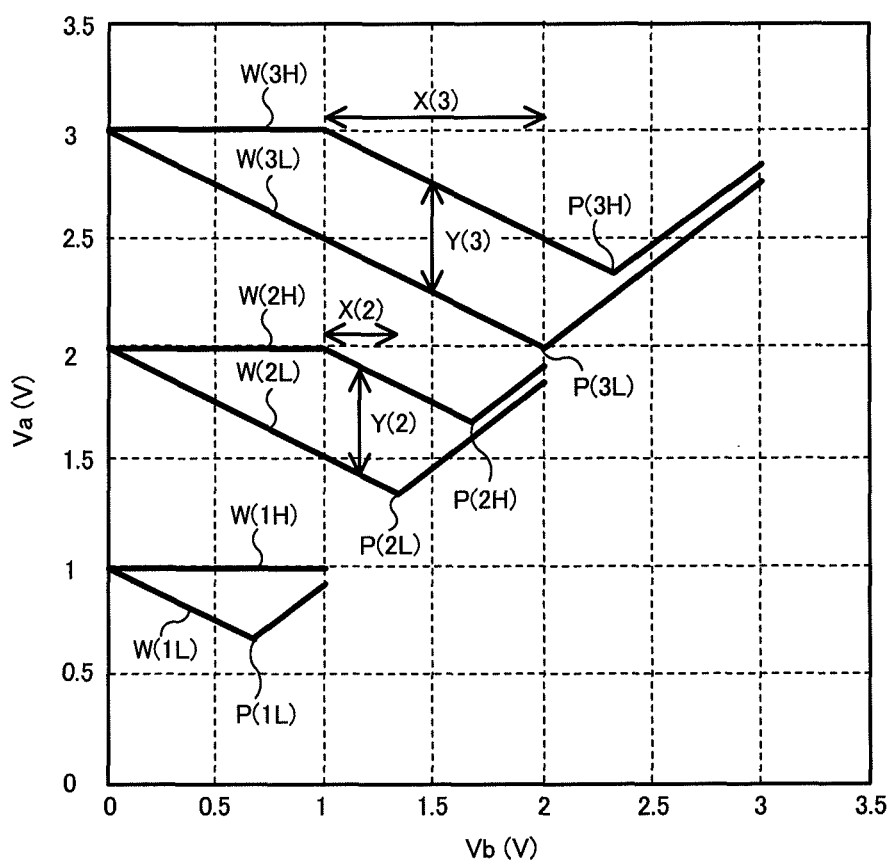
FIG. 6 is a diagram showing a first comparison example corresponding to the amplifying operation of the conventional sense amplifier circuit.
Figure 7:
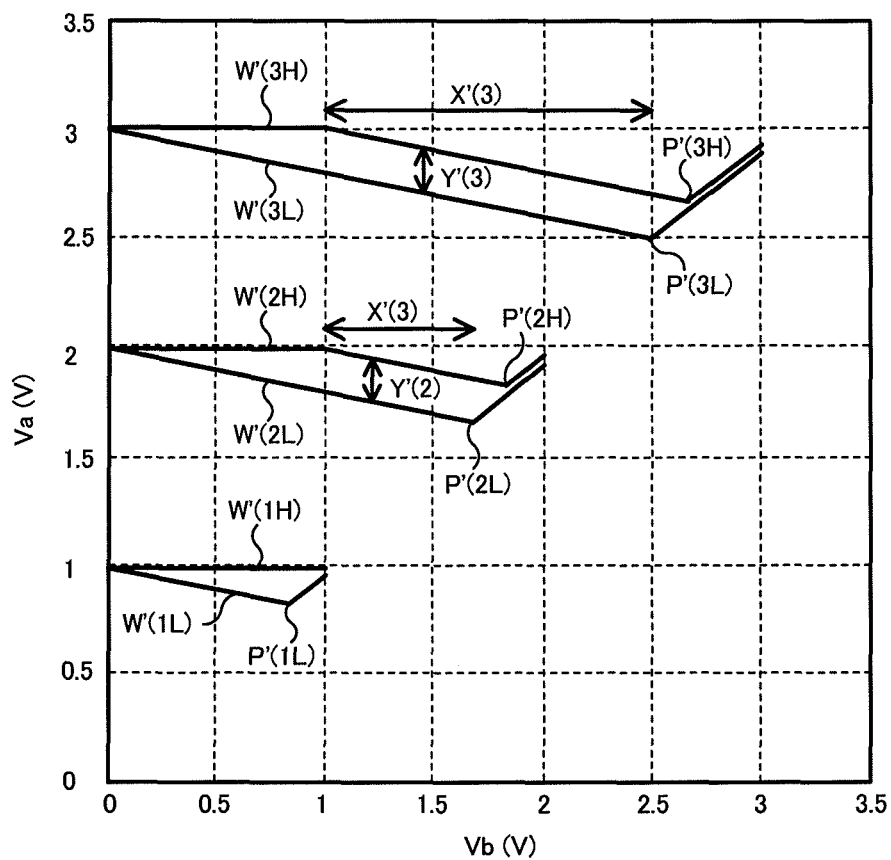
FIG. 7 is a diagram showing a second comparison example corresponding to the amplifying operation of the conventional sense amplifier circuit.

Here, FIGS. 6 and 7 show two graphs corresponding to the amplifying operation of the conventional sense amplifier circuit (FIG. 29) as a comparison example of FIGS. 5A and 5B. In each of FIGS. 6 and 7, the power supply voltage VDD is assumed to be operated under 3V, and characteristics in reading high-level/low-level data are shown for three conditions of voltages VDD=3V, 2V, 1V. Further, Cs=5 fF is set in FIG. 6 corresponding to FIG. 5A, and Cs=2 fF is set in FIG. 7 corresponding to FIG. 5B. Also, Cb=50 fF and Ca=10 fF are set in both FIGS. 6 and 7. In FIG. 6, values (3, 2, 1) of VDD, high-level data (H) and low-level data (L) are denoted with parentheses for respective values of the characteristics W, the changing points P, the permissible ranges X and Y along the vertical and horizontal axes. Also, the same representations are shown in FIG. 7 for characteristics W', changing points P', and permissible ranges X' and Y' along the vertical and horizontal axes. Here, X and X' indicate permissible ranges of a set value of the voltage Vb, while Y and Y' indicate a difference between read signal voltages of high-level and low-level data in the permissible ranges X and X'.

In the conventional sense amplifier circuit, positions of the changing points P and P' are shifted to right in a case of the power supply voltage VDD=3V/2V, and thus it is understood that the charge transfer mode is dominant. Here, the difference between read signal voltages is decreased in the case of Cs=2 fF in FIG. 7, in which memory cells MC having a lower capacitance is employed, relative to the case of Cs=5 fF in FIG. 6. Further, as apparent from FIGS. 6 and 7, it is difficult to obtain the above-mentioned permissible ranges X and Y under a condition of VDD=1V, and it is also difficult to use the conventional sense amplifier circuit in such a low-voltage operation. As described above, the case of FIG. 5 has a remarkable difference in that operating margin is largely improved particularly under the condition of low voltage operation of VDD=1V in comparison with FIGS. 6 and 7. This is mainly an effect due to a reduction in the capacitance Ca at the sense node Ns by employing the single-ended preamplifier 10.

In addition, the characteristic W(1 L) at VDD=1V in FIG. 6 is represented by a dotted line in FIG. 5A, and the characteristic W' (1 L) at VDD=1V in FIG. 7 is represented by a dotted line in FIG. 5B, which are compared with each other.

Second Embodiment

Figure 8:
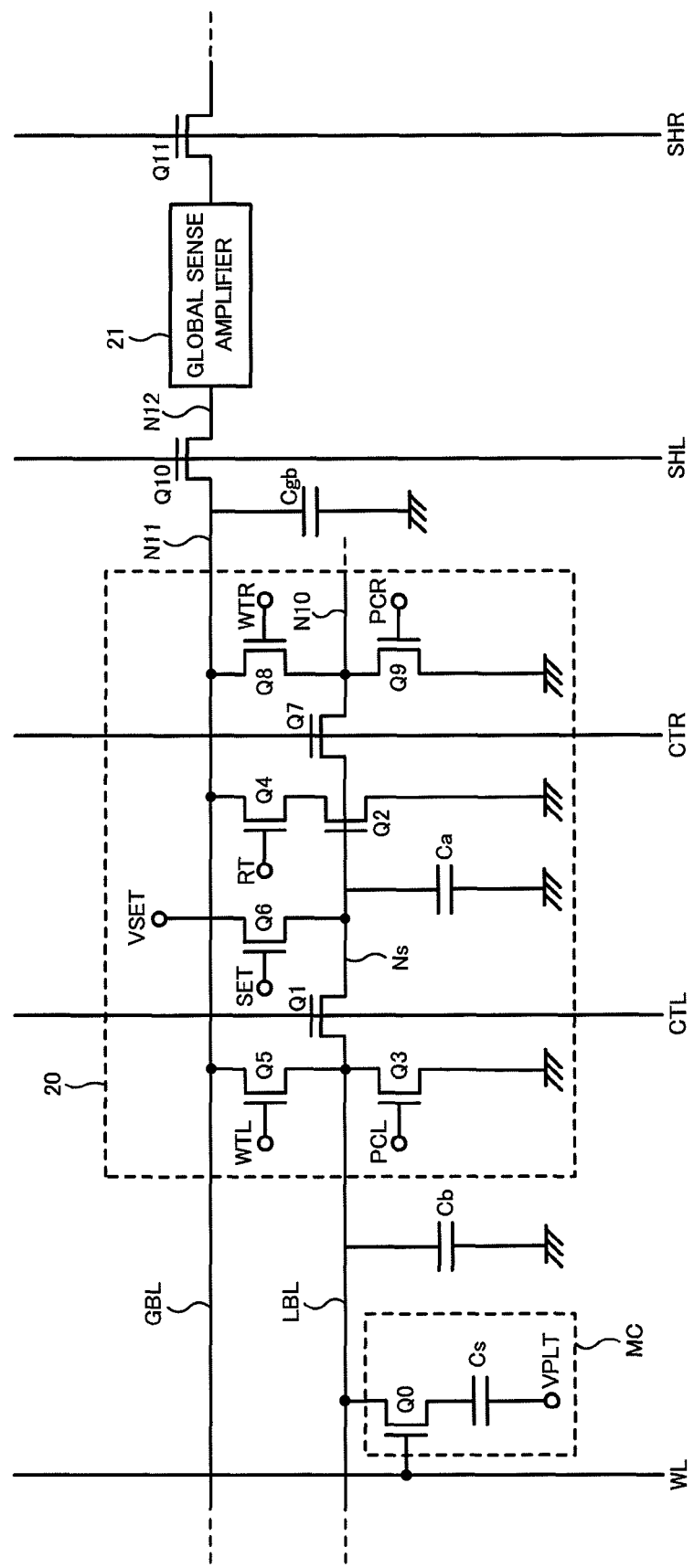
FIG. 8 is a diagram showing a configuration example of a sensing part in a DRAM of a second embodiment.

Next, a second embodiment of the invention will be described. In the second embodiment, a hierarchical memory cell array is formed, and the charge transfer/distributing type single-ended sense amplifier of the first embodiment is applied to a DRAM having hierarchical bit lines and hierarchical sense amplifier circuits. FIG. 8 shows a configuration example of a sensing part in the DRAM of the second embodiment, in which a memory cell MC, a local bit line LBL and a global bit line GBL which serve as the hierarchical bit lines, and a local sense amplifier 20 and a global sense amplifier 21 which serve as the hierarchical sense amplifier circuits are respectively shown. The local bit line LBL connected to the memory cell MC is selectively connected to the global bit line GBL via the local sense amplifier 20, and data thereof is transmitted to the corresponding global sense amplifier 21. Although FIG. 8 shows only part of the configuration, the second embodiment employs the configuration in which each local sense amplifier 20 is shared by local bit lines LBL on both sides and each global sense amplifier 21 is shared by global bit lines GBL on both sides. Thereby, the number of the local sense amplifiers 20 and the number of global sense amplifiers 21 can be reduced so as to reduce the chip area.

The memory cell MC has the same structure as that in FIG. 3 of the first embodiment. In the second embodiment, for example, 32 memory cells MC are connected to one local bit line LBL. In this case, the bit line capacitance Cb formed at the local bit line LBL has, for example, a capacitance Cb=3 fF. Further, one local sense amplifier 20 is shared by two local bit lines LBL, so that 64 memory cells MC are connected to the local sense amplifier 20. In the local sense amplifier 20, a circuit portion including the MOS transistors Q1 to 6 is common to the preamplifier 10 of the first embodiment. Meanwhile, MOS transistors Q7, Q8 and Q9 which are not included in the preamplifier 10 of FIG. 3 are added in the local sense amplifier 20 of FIG. 8. Regarding the MOS transistor inserted in the local bit line LBL, there is provided only one MOS transistor Q1 functioning as the charge transfer gate of one local bit line LBL in FIG. 3, and in contrast, there are provided MOS transistors Q1 and Q7 functioning as two charge transfer gates connected to the local bit lines LBL of both sides in FIG. 8. Further, the MOS transistor Q8 functions as a transistor for the write control, and the MOS transistor Q9 functions as a transistor for precharging the local bit line LBL (node N10).

In FIG. 8, a control signal CTL is applied to the gate of the MOS transistor Q1 of the left side, and a control signal CTR is applied to the gate of the MOS transistor Q7 of the right side. A control signal WTL is applied to the gate of the MOS transistor Q5 of the left side, and a control signal WTR is applied to the gate of the MOS transistor Q8 of the right side. A precharge signal PCL is applied to the gate of the MOS transistor Q3 of the left side, and a precharge signal PCR is applied to the gate of the MOS transistor Q9 of the right side.

Further, for example, eight local sense amplifiers 20 are connected to one global bit line GBL. In this case, 512 memory cells MC in total can be selectively connected to one global bit line GBL. A parasitic capacitance Cgb is formed at each global bit line GBL. There are provided a MOS transistor Q10 switching connection to one global bit line GBL and a MOS transistor Q11 switching connection to the other global bit line GBL, on both sides of the global sense amplifier 21. Then, the global sense amplifier 21 can be selectively connected to either of the global bit lines GBL on both sides by using a control signal SHL applied to the gate of the MOS transistor Q10 and a control signal SHR applied to the gate of the MOS transistor Q11.

Figure 9:
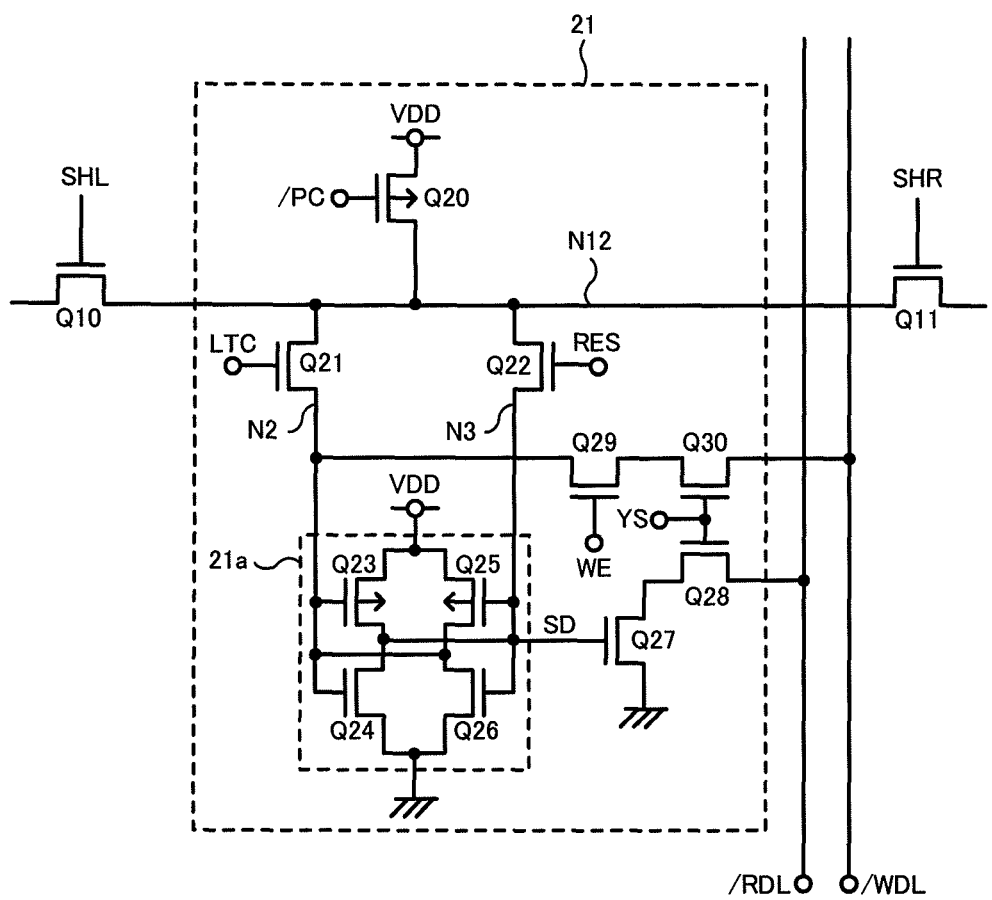
FIG. 9 is a diagram showing an example of a circuit configuration of a global sense amplifier of FIG. 8.

FIG. 9 shows an example of a circuit configuration of the global sense amplifier 21. As shown in FIG. 9, the global sense amplifier 21 has substantially the same circuit configuration as the sense latch circuit 11 of the first embodiment (FIG. 4), so description thereof will be omitted. However, a difference exists in that a node N12 in FIG. 9 corresponding to the input/output node N1 in FIG. 4 is connected to the above two MOS transistors Q10 and Q11 on both sides of the global sense amplifier 21.

Figure 10A:
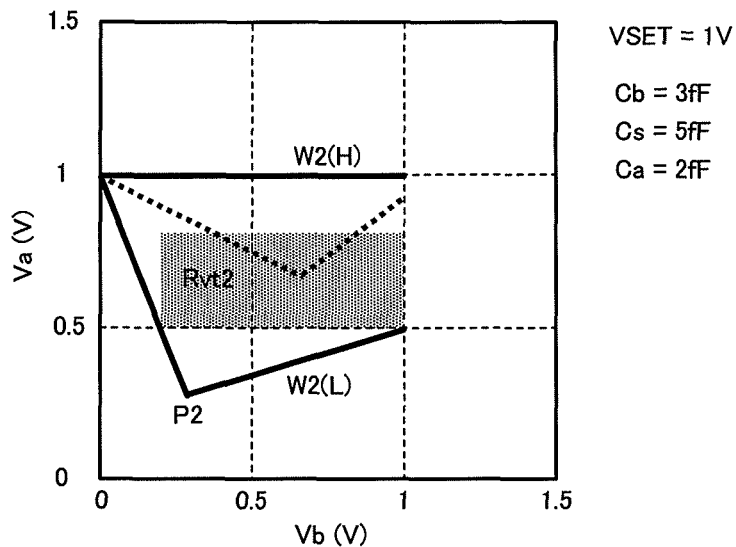
FIGS. 10A and 10B are diagrams for explaining an amplifying operation of the sense amplifier circuit of the second embodiment.
Figure 10B:
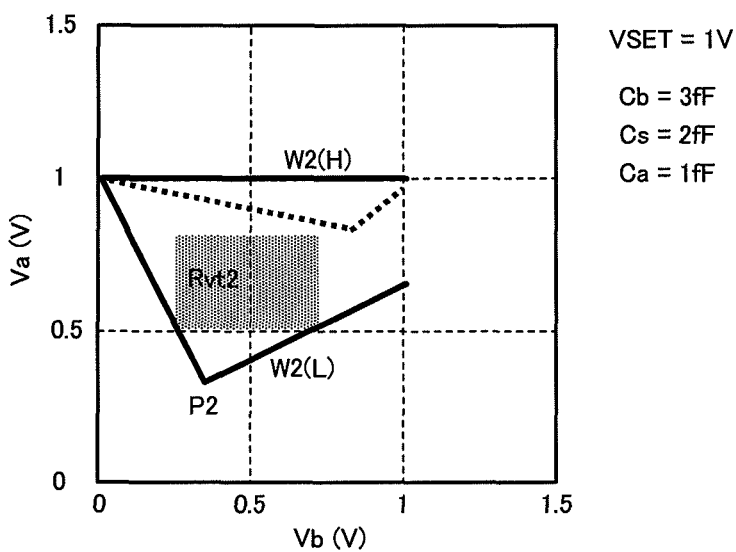

FIGS. 10A and 10B show two graphs for explaining an amplifying operation of the sense amplifier circuit of the second embodiment. The two graphs as shown in FIGS. 10A and 10B correspond to two conditions of capacitances for the relation between the voltages Va and Vb similarly as in FIGS. 5A and 5B of the first embodiment. A characteristic W2(H) represents a characteristic when reading high-level data from the memory cell MC (Vs=1V), and a characteristic W2(H) represents a characteristic when reading low-level data from the memory cell MC (Vs=0V). Further, regarding the bit line capacitance Cb, the capacitance Cs of the memory cell MC, and the capacitance Ca at the sense node Ns, Cb=3 fF, Cs=5 fF and Ca=2 fF are set in FIG. 10A, and Cb=3 fF, Cs=2 fF and Ca=1 fF are set in FIG. 10B. Other conditions are the same as in FIG. 5.

Each of FIGS. 10A and 10B also shows a setting example of a variation permissible range Rvt2 for the threshold voltage similarly as in FIGS. 5A and 5B. In the graphs of FIGS. 10A and 10B, it is found that the variation permissible range Rvt2 can be set to be larger within an area surrounded by the characteristics W2 (H) and W2 (L), in comparison with the graphs of FIGS. 5A and 5B. That is, this means that the operating margin of the local sense amplifier 20 increases. This is an effect of a decrease in the bit line capacitance Cb of the local bit line LBL resulting from the hierarchical structure of bit lines. As described above, the local bit line LBL is driven to the voltage Vb=Vg−Vt1 via the MOS transistor Q1 having the threshold voltage Vt1, and however the time required for the operation is shortened with a decrease in the bit line capacitance Cb, thereby obtaining an additional effect of high-speed read operation. Furthermore, when the local bit line LBL is driven to the voltage Vb=Vg−Vt1, the gate voltage Vg applied to the gate of the MOS transistor Q1 is set to a high voltage Vg2 and thereafter set to a voltage Vg1 lower than the voltage Vg2, and thus the MOS transistor Q1 is overdriven. Thereby, it is possible to shorten a time required in an operation to drive the local bit line LBL to the voltage Vb so that higher-speed reading can be achieved. The above-mentioned overdriving will be described later.

Figure 11:
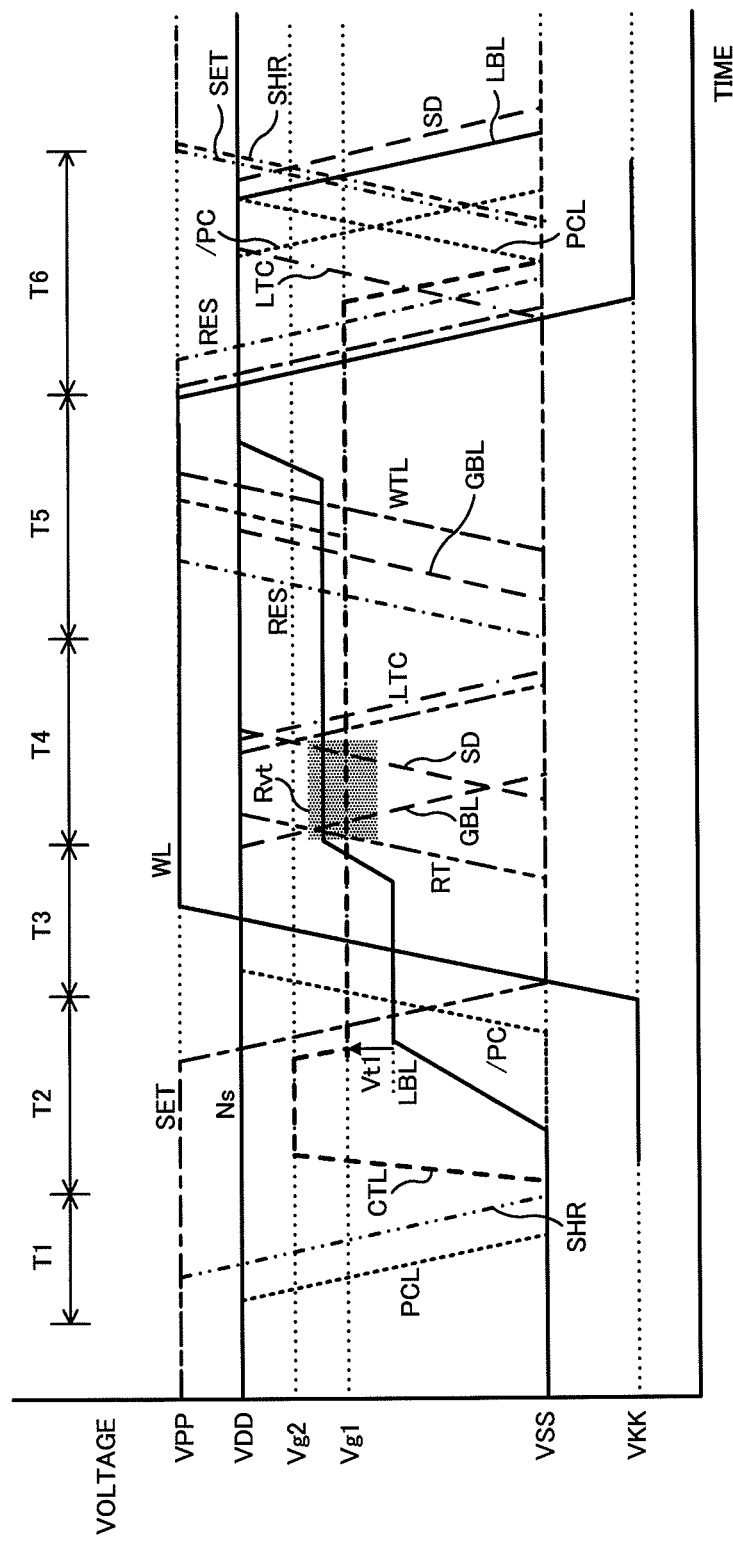
FIG. 11 is a diagram for explaining a read operation in the DRAM of the second embodiment and showing operation waveforms in a case of reading high-level data from a memory cell.
Figure 12:
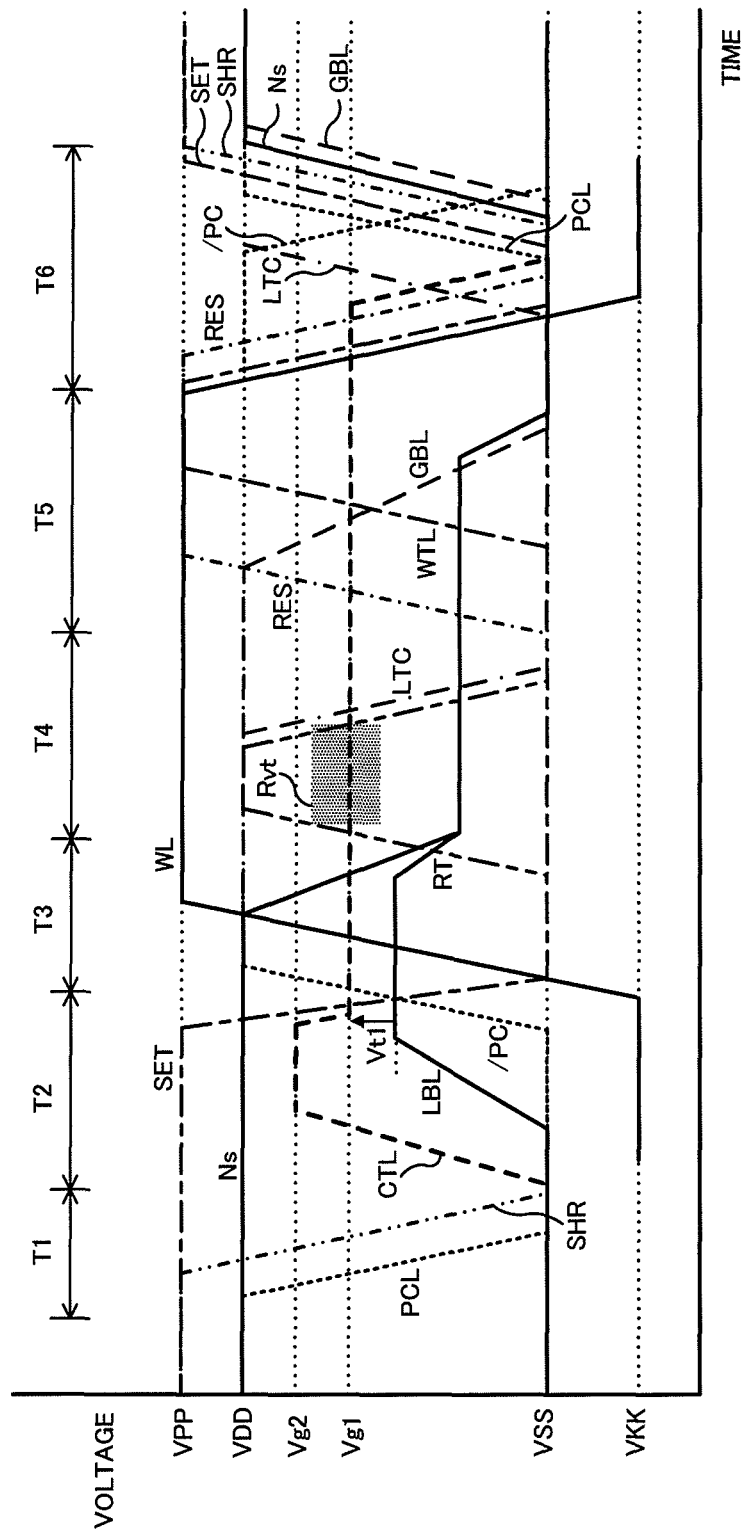
FIG. 12 is a diagram for explaining a read operation in the DRAM of the second embodiment and showing operation waveforms in a case of reading low-level data from the memory cell.

Next, a read operation in the DRAM of the second embodiment will be described with reference to FIGS. 11 and 12. FIG. 11 shows operation waveforms in a case of reading high-level data from the memory cell MC, and FIG. 12 shows operation waveforms in a case of reading low-level data from the memory cell MC. As shown in upper parts of FIGS. 11 and 12, the entire operation is divided into six terms (T1 to T6).

In the read operation of the high-level data as shown in FIG. 11, the local bit line LBL is precharged to the ground potential VSS (0V), the sense node Ns is precharged to the positive voltage VSET, and the global bit line GBL is precharged to the power supply voltage VDD, before a precharge cancellation term T1.

The above operation waveforms indicate a case where VSET=1V is satisfied, which means that the positive voltage VSET is equal to the power supply voltage VDD. At this point, the precharge signals PCL, PCR, the control signals SHL, SHR and the latch control signal LTC are respectively high, and the inverted precharge signal /PC and the control signals WTL, WTR, RT, RES, CTL and CTR are respectively low. In addition, the positive voltage VSET may be set to a voltage different from the power supply voltage VDD.

In the precharge cancellation term T1, the precharge signal PCL is controlled to be low so that the MOS transistor Q3 is turned off, and the local bit line LBL connected to the MOS transistors Q3 is precharged to the ground potential VSS and becomes floating. The precharge signal PCR is maintained to be high, the MOS transistor Q9 is in an on state, and the local bit line LBL connected to the MOS transistor Q9 is maintained at the ground potential VSS. Further, the control signal SHR is controlled to be low, and the non-selected global bit line GBL is disconnected from the global sense amplifier 21. In addition, the non-selected local sense amplifier 20 is maintained in a state where the control signals RT, WTL, WTR, CTL and CTR are controlled to be low and the sense node Ns is maintained at the positive voltage VSET.

In a local bit line voltage set term T2, the control signal CTL is controlled to be the high voltage Vg2 for overdriving and is maintained in this state for a given period. The MOS transistor Q1 is turned on by the control signal CTL which has become the voltage Vg2, and the local bit line LBL is connected to the sense node Ns in the local sense amplifier 20. Thereafter, the local bit line LBL is driven via the MOS transistor Q1. The control signal CTL is controlled to be the voltage Vg1 lower than the voltage Vg2 shortly before the local bit line LBL is driven to the voltage Vg−Vt1, and subsequently the local bit line LBL is driven to the voltage Vg1−Vt1 so as to turn off the transistor Q1. Thereafter the control signal SET is controlled to be low, and the sense node Ns is maintained at the positive voltage VSET. As describe above, since the gate voltage Vg is overdriven from the high voltage Vg2 to the low voltage Vg1, there is an effect that the potential of the local bit line LBL rapidly rises during a period when the voltage Vg2 is maintained. In addition, a value of the voltage Vg2 and a predetermined period of setting the Vg2 can be appropriately set in accordance with the entire operation and the voltage relation.

In a cell selection term T3, the word line WL is driven from the negative voltage VKK to the positive voltage VPP. Thereby, a signal voltage of the memory cell MC maintaining high level is read out to the local bit line LBL. At this point, since the voltage Vb of the local bit line LBL is higher than the voltage Vg1-Vt1, the MOS transistor Q1 is maintained off. Thus, the sense node Ns is maintained in a state of being precharged to the positive voltage VSET.

In a sense term T4, the control signal RT is controlled to be high and is maintained in this state for a given period. At this point, since the potential of the sense node Ns is higher than the upper limit of the variation permissible range Rvt of the threshold voltage Vt2 of the MOS transistor Q2, a large drain current flows through the MOS transistor Q2. Accordingly, electric charge which is charged in the parasitic capacitance Cgb at the global bit line GBL is extracted in a short time by the MOS transistor Q2, and thus the global bit line GBL is rapidly discharged so that its potential changes from the power supply voltage VDD to the ground potential VSS. The potential of the global bit line GBL reaches the ground potential VSS at the end of the sense term T4 and is inverted by the signal voltage decision latch 21a of the global sense amplifier 21 so that the output signal SD changes to the power supply voltage VDD. Thereafter, the latch control signal LTC is controlled to be low, and the sense term T4 is finished.

In addition, the variation permissible range Rvt of the threshold voltage Vt2 of the MOS transistor Q2 is determined depending on a range in which an entire variation distributed, for example, depending on a minute variation in dimension when forming transistors, variation in thickness of a gate insulating film, a random fluctuation in channel impurity distribution, or the temperature.

Subsequently, in a restore term T5, the control signal RES is controlled to be the positive voltage VPP, the output signal SD of the global sense amplifier 21 is outputted to the global bit line GBL via the MOS transistor Q22, and the potential of the global bit line GBL changes to the power supply voltage VDD. Subsequently, the control signal WTL is controlled to be the positive voltage VPP, and the global bit line GBL is connected to the local bit line LBL via the MOS transistor Q5. Thereby, the high-level data is rewritten into the memory cell MC.

In a precharge term T6, the word line WL is returned to the negative voltage VKK. Subsequently, the control signals WTL, RES and CTL are controlled to be low, and the latch control signal LTC is controlled to be high. Subsequently, the precharge signal PCL and the control signal SET are controlled to be high, the inverted precharge signal /PC is controlled to be low, the local bit line LBL is precharged to the ground potential VSS, the sense node Ns is precharged to the positive voltage VSET, and the global bit line GBL is precharged to the power supply voltage VDD. Thereby, the output signal SD of the signal voltage decision latch 21a changes to low. Finally, the control signal SHR is controlled to be the positive voltage VPP, and the read operation is completed.

Next, as shown in FIG. 12, the operation until the local bit line voltage set term T2 in reading low-level data is performed in the same manner as in FIG. 11, so description thereof will be omitted. In the subsequent cell selection term T3, the word line WL is driven from the negative voltage VKK to the positive voltage VPP, and a signal voltage of the memory cell MC maintaining low level is read out to the local bit line LBL. At this point, since the voltage Vb of the local bit line LBL is lower than the voltage Vg1-Vt1, the MOS transistor Q1 is turned on. As a result, electric charge of the capacitance Ca at the sense node Ns is transferred to the local bit line LBL via the MOS transistor Q1 in the charge transfer mode or the charge distributing mode, and thereby the voltage Va at the sense node Ns is lowered.

In the sense term T4, the control signal RT is controlled to be high and is maintained in this state for a given period. At this point, since the potential of the sense node Ns is lower than the lower limit of the variation permissible range Rvt of the threshold voltage Vt2 of the MOS transistor Q2, the drain current does not flow through the MOS transistor Q2. Thus, the potential of the global bit line GBL is maintained at the power supply voltage VDD. The potential of the global bit line GBL reaches the power supply voltage VDD at the end of the sense term T4, the potential is inverted by the signal voltage decision latch 21a of the global sense amplifier 21, and the output signal SD is maintained at the ground potential VSS. Thereafter, the latch control signal LTC is controlled to be low, and the sense term T4 is finished.

In the restore term T5, the control signal RES is controlled to be the positive voltage VPP, the output signal SD of the global sense amplifier 21 is outputted to the global bit line GBL via the MOS transistor Q22, and the potential of the global bit line GBL changes to the ground potential VSS. Subsequently, the control signal WTL is controlled to be the positive voltage VPP, and the global bit line GBL is connected to the local bit line LBL via the MOS transistor Q5. Thereby, the low-level data is rewritten into the memory cell MC.

In the precharge term T6, the word line WL, the control signals WTL, RES and CTL, the latch control signal LTC, the precharge signal PCL, and the inverted precharge signal /PC are controlled in the same manner as in FIG. 11. At this point, the local bit line LBL, the sense node Ns and the global bit line GBL are respectively precharged, each of which returns to an initial state. Finally, the control signal SHR is controlled to be the positive voltage VPP, and the read operation is completed.

Here, the operation waveforms shown in FIGS. 11 and 12 are applied to the read operation of the second embodiment, and also substantially the same operation waveforms can be applied to the first embodiment. In this case, the local bit line LBL may be replaced with the bit line BL, the global bit line GBL may be replaced with the input/output node N1, the control signal CTL may be replaced with the gate voltage Vg, the control signal WTL may be replaced with the control signal WT, the precharge signal PCL may be replaced with the precharge signal PC, the positive voltage VSET may be replaced with the power supply voltage VDD, and the control signals CTR, WTR, PCR and SHR may be neglected.

Third Embodiment

Next, a third embodiment of the invention will be described. In a DRAM of the third embodiment, hierarchical bit lines and hierarchical sense amplifier circuits are configured in the same manner as the second embodiment, part of which differs from the second embodiment. Although the circuit configuration in FIG. 9 of the second embodiment is almost common to the third embodiment, a configuration of certain power source circuits is modified. That is, a compensated voltage generating circuit which compensates fluctuation of the threshold voltage Vt1 of the MOS transistor Q1 and a compensated voltage generating circuit which compensates fluctuation of the threshold voltage Vt2 of the MOS transistor Q2 are employed. Specific configurations thereof will be described below.

Figure 13:
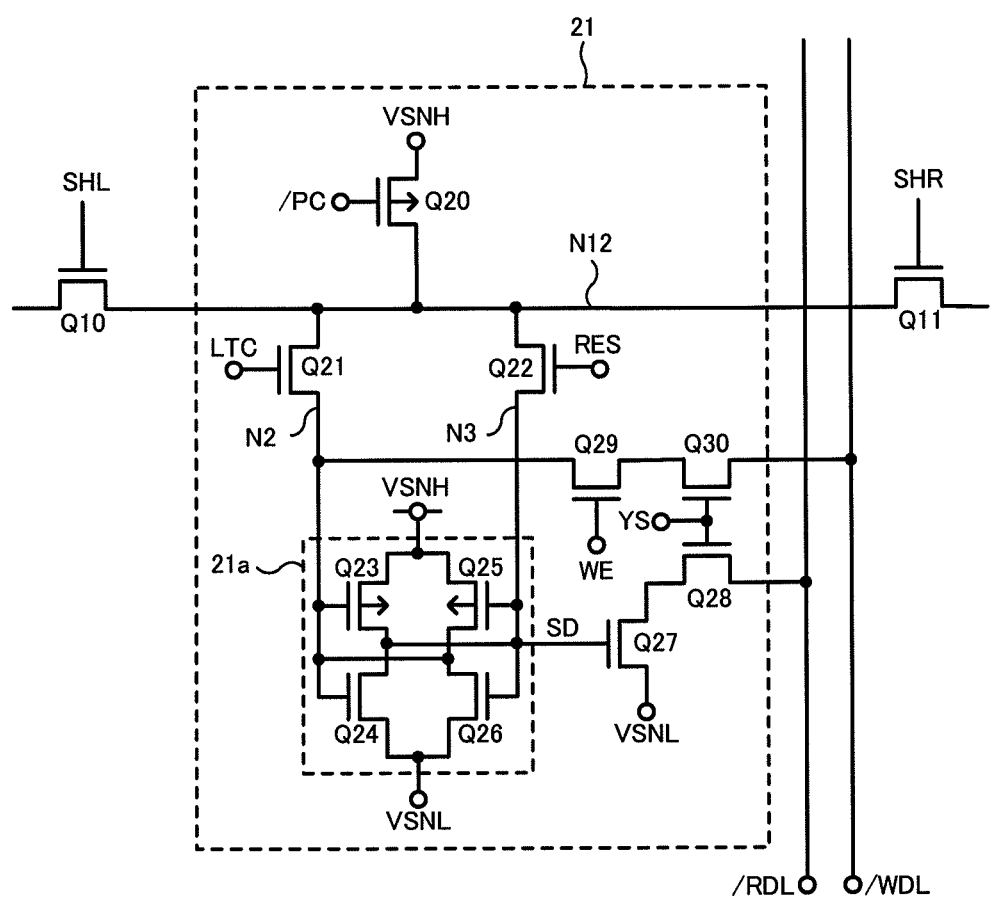
FIG. 13 is a diagram showing an example of a circuit configuration of a global sense amplifier of a third embodiment.

FIG. 13 shows an example of a circuit configuration of the global sense amplifier 21 of the third embodiment. The basic circuit configuration in FIG. 13 is almost common to FIG. 9 of the second embodiment, in which however a difference exists in the power source circuits as mentioned above. That is, the power supply voltage VDD supplied to the MOS transistor Q20 and the signal voltage decision latch 21a is replaced with a voltage VSNH, and the ground potential VSS supplied to the MOS transistor Q27 and the signal voltage decision latch 21a is replaced with a voltage VSNL. The above compensated voltage generating circuits are employed in order to generate the voltages VSNH and VSNL, which will be described in detail below.

Figure 14:
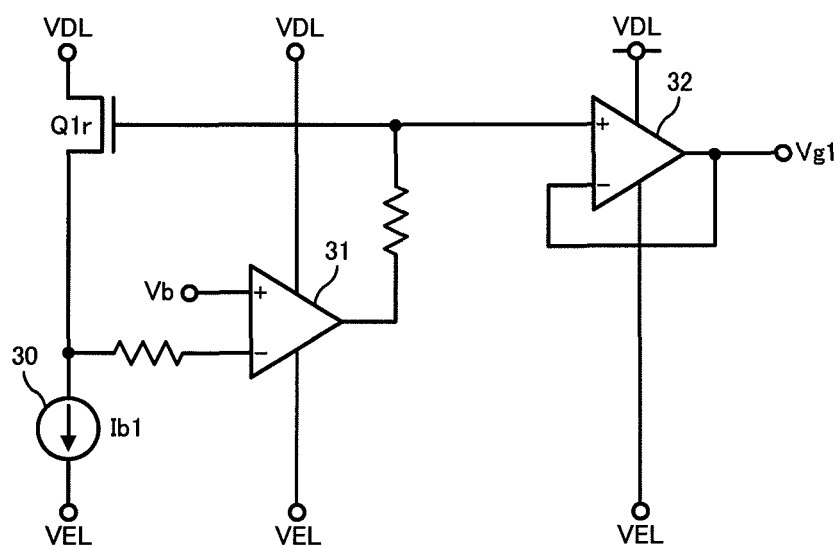
FIG. 14 is a diagram showing a first circuit configuration example of a gate voltage generating circuit functioning as a compensated voltage generating circuit of the third embodiment.

FIG. 14 shows a first circuit configuration example of a gate voltage generating circuit functioning as the above compensated voltage generating circuit of the third embodiment. This gate voltage generating circuit is a feedback type power supply generating circuit generating the voltage Vg1 in which the fluctuation of the threshold voltage Vt1 of the MOS transistor Q1 is compensated, and is used for the purpose of, for example, applying the control signal CTL controlled to have a desired voltage value to the gate of the MOS transistor Q1. As shown in FIG. 14, the gate voltage generating circuit includes a replica MOS transistor Q1r, a constant current source 30, and two operational amplifiers 31 and 32. Further, a positive voltage VDL and a negative voltage VEL are used as a pair of constant voltage power supplies, the positive voltage VDL is supplied to the replica MOS transistor Q1r and to the operational amplifiers 31 and 32, and the negative voltage VEL is supplied to one end of the constant current source 30 and to the operational amplifiers 31 and 32.

In FIG. 14, the replica MOS transistor Q1r functions as a replica transistor of the MOS transistor Q1 of the local sense amplifier 20 (FIG. 8), and formed in the same shape and size as the MOS transistor Q1. A drain current equal to a constant current Ib1 flowing in the constant current source 30 connected to the source of the replica MOS transistor Q1r flows in the replica MOS transistor Q1r. The operational amplifier 31 receives a source voltage of the replica MOS transistor Q1r at a minus-side input terminal via a resistor, and receives the voltage Vb at a plus-side input terminal. An output voltage of the operational amplifier 31 is inputted to the gate of the replica MOS transistor Q1r via a resistor. In this case, feedback control is performed so that the output voltage of the operational amplifier 31 matches a value obtained by adding the voltage Vb to the threshold voltage Vt1 of the replica MOS transistor Q1r. Meanwhile, the subsequent operational amplifier 32 receiving the output voltage of the operational amplifier 31 forms a voltage follower to strengthen current driving ability, and outputs the voltage Vg1 equal to Vb+Vt1.

The voltage Vg1 outputted from the gate voltage generating circuit of FIG. 14 is applied to the gate of the MOS transistor Q1 in the sensing operation. With the fluctuation of the threshold voltage Vt1 of the MOS transistor Q1 in the configuration of FIG. 8, the voltage Vb of the local bit line LBL given by Vb=Vg1−Vt1 fluctuates. Meanwhile, in the third embodiment, since the gate voltage generating circuit of FIG. 14 generates the voltage Vg1 in which the threshold voltage Vt1 is compensated, the value of the voltage Vb is always maintained constant even when the threshold voltage Vt of MOS transistors fluctuates due to manufacturing process and temperature. Accordingly, actual variations can be small enough relative to the variation permissible range Rvt of the threshold voltage in FIGS. 5A and 5B or FIG. 10, thereby further improving the operating margin of the sense amplifier circuit. By employing the gate voltage generating circuit of FIG. 14, a variation factor actually existing is becomes restrictive, which is based on a difference between characteristics of the MOS transistor Q1 and the replica MOS transistor Q1r, thereby reliably enabling the compensation of the manufacturing process or temperature.

Figure 15:
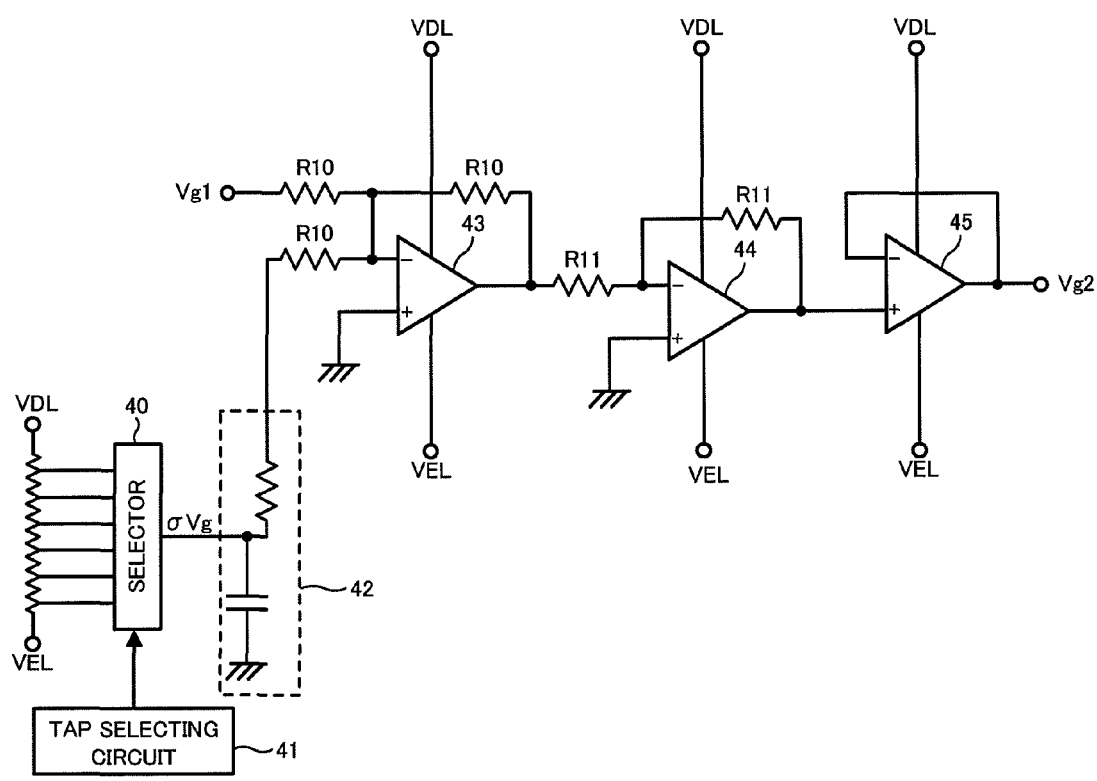
FIG. 15 is a diagram showing a second circuit configuration example of the gate voltage generating circuit functioning as the compensated voltage generating circuit of the third embodiment.

FIG. 15 shows a second circuit configuration example of the gate voltage generating circuit functioning as the above compensated voltage generating circuit of the third embodiment. This gate voltage generating circuit is a feedback type power supply generating circuit generating the voltage Vg2 in which the fluctuation of the threshold voltage Vt1 of the MOS transistor Q1 is compensated, and is used for the purpose of, for example, temporarily applying the control signal CTL having the voltage Vg2 higher than the voltage Vg1 to the gate of the MOS transistor Q1.

The gate voltage generating circuit of FIG. 15 includes a selector 40, a tap selecting circuit 41, a low pass filter 42, and three operational amplifiers 43, 44 and 45. The selector 40 functioning as a setting circuit setting the voltage difference between the voltages Vg1 and Vg2 sets a desired voltage selected from a large number of intermediate voltages between the positive power supply voltage VDL and the negative power supply voltage VEL by resistive division based on information sent from the tap selecting circuit 41, and outputs a voltage δVg corresponding to the voltage difference between the voltages Vg1 and Vg2. Selection of the intermediate voltages in the selector 40 is programmed in the tap selecting circuit 41. That is, respective values for the voltages Vg1 and Vg2 to be set are programmed. For the purpose of programming, it is possible to utilize, for example, laser fuses, electrical fuses, a nonvolatile memory element, or a one-time programmable element.

In the first operational amplifier 43, the voltage Vg1 and the voltage δVg smoothed through the low pass filter 42 composed of a resistor and a capacitor are inputted to a minus-side input terminal respectively through resistors R10. Then, the first operation amplifier 43 outputs a voltage −(Vg1+δVg) obtained by adding the voltages Vg1 and δVg and inverting and amplifying it. The second operational amplifier 44 receives the output of the first operation amplifier 43 and inverts and amplifiers it so as to output the voltage Vg1+δVg. The third operational amplifier 45 forms a voltage follower and outputs the voltage Vg1+δVg (voltage Vg2). The voltage Vg2 outputted from the gate voltage generating circuit of FIG. 15 is applied to the gate of the MOS transistor Q1 before the sensing operation. The gate voltage Vg of the MOS transistor Q1 can be controlled so that the two voltages Vg1 and Vg2 change in conjunction with each other, and thereby time delay until the local bit line LBL is driven to the voltage Vg1−Vt can be prevented so that high-speed read operation can be achieved.

Figure 16:
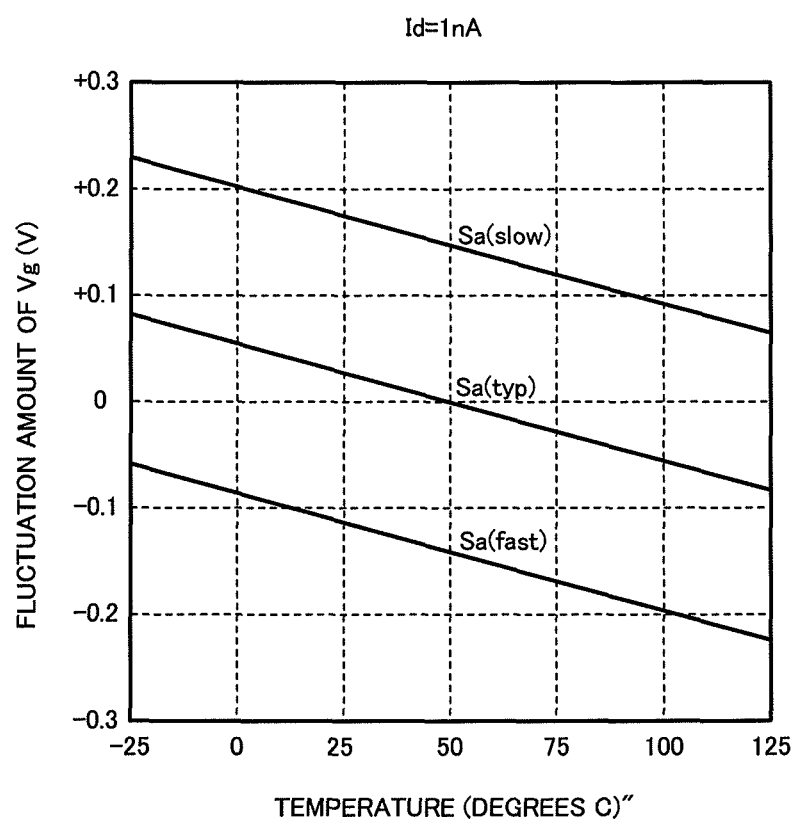
FIG. 16 is a graph showing an example of process/temperature dependency of a gate voltage Vg outputted from the above gate voltage generating circuit of FIG. 15.

FIG. 16 is a graph showing a relation between temperature and a fluctuation amount of the gate voltage Vg, in which three types of characteristics including a typical operation characteristic Sa(typ), a fast operation characteristic Sa(fast) and a slow operation characteristic Sa(slow) are compared corresponding to manufacturing process in the gate voltage generating circuit of FIG. 15. The fluctuation amount of the gate voltage Vg along a vertical axis is a value obtained by a criterion in which the manufacturing process is "typ" and the temperature is 50 degrees. Here, the current Ib1 of the constant current source 30 of FIG. 14 is desired to be set to a small value, for example, 1 nA. This is because when driving the local bit line LBL to the voltage Vb, a value of the current flowing in the MOS transistor Q1 finally becomes extremely small and the current Ib1 needs to match this value.

Figure 17:
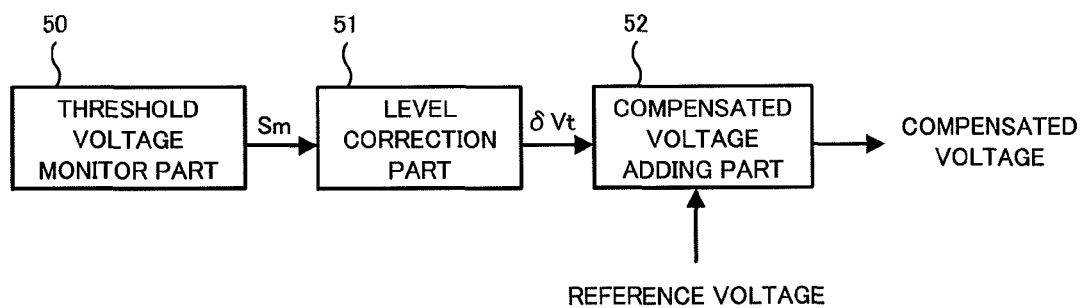
FIG. 17 is a block diagram showing another example of the compensated voltage generating circuit of the third embodiment.

Next, FIG. 17 is a block diagram showing another example of the compensated voltage generating circuit of the third embodiment, which is used to generate, for example, the voltages VSNH and VSNL (FIG. 13) and the cell plate voltage VPLT (FIG. 8). As shown in FIG. 17, the compensated voltage generating circuit includes a threshold voltage monitor part 50 which monitors the threshold voltage Vt2 of the MOS transistor Q2 of the local sense amplifier 20 and generates a monitor signal Sm, a level correction part 51 which shifts the monitor signal Sm from the threshold voltage monitor part 50 by a correction amount corresponding to the manufacturing process and generates a correction signal δVt, and a compensated voltage adding part 52 which generates a compensated voltage by adding the reference voltage and the correction signal δVt of the level correction part 51.

Figure 18:
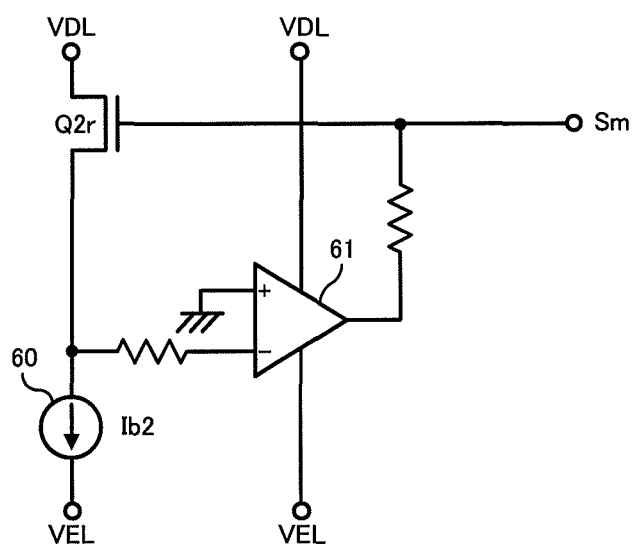
FIG. 18 is a diagram showing a circuit configuration example of a threshold voltage monitor part of FIG. 17.

FIG. 18 shows a circuit configuration example of the threshold voltage monitor part 50 of FIG. 17. As shown in FIG. 18, the threshold voltage monitor part 50 includes a replica MOS transistor Q2r, a constant current source 60 and an operational amplifier 61. The replica MOS transistor Q2r functions as a replica transistor of the MOS transistor Q2 to be monitored, and formed in the same shape and size as the MOS transistor Q2. The constant current source 60 in which a constant current Ib2 flows has the same connection relation as the constant current source 30 of FIG. 14. The operational amplifier 61 receives a source voltage of the replica MOS transistor Q2r at a minus-side input terminal via a resistor, and receives the ground potential at a plus-side input terminal. An output voltage of the operational amplifier 61 is inputted to the gate of the replica MOS transistor Q2r via a resistor. In this case, feedback control is performed for the output signal Sm of the operational amplifier 61 so that the source voltage of the replica MOS transistor Q2r matches the ground potential. Accordingly, the threshold voltage Vt2 of the MOS transistor Q2r can be monitored by using the ground potential as a criterion based on the output signal Sm.

Figure 19:
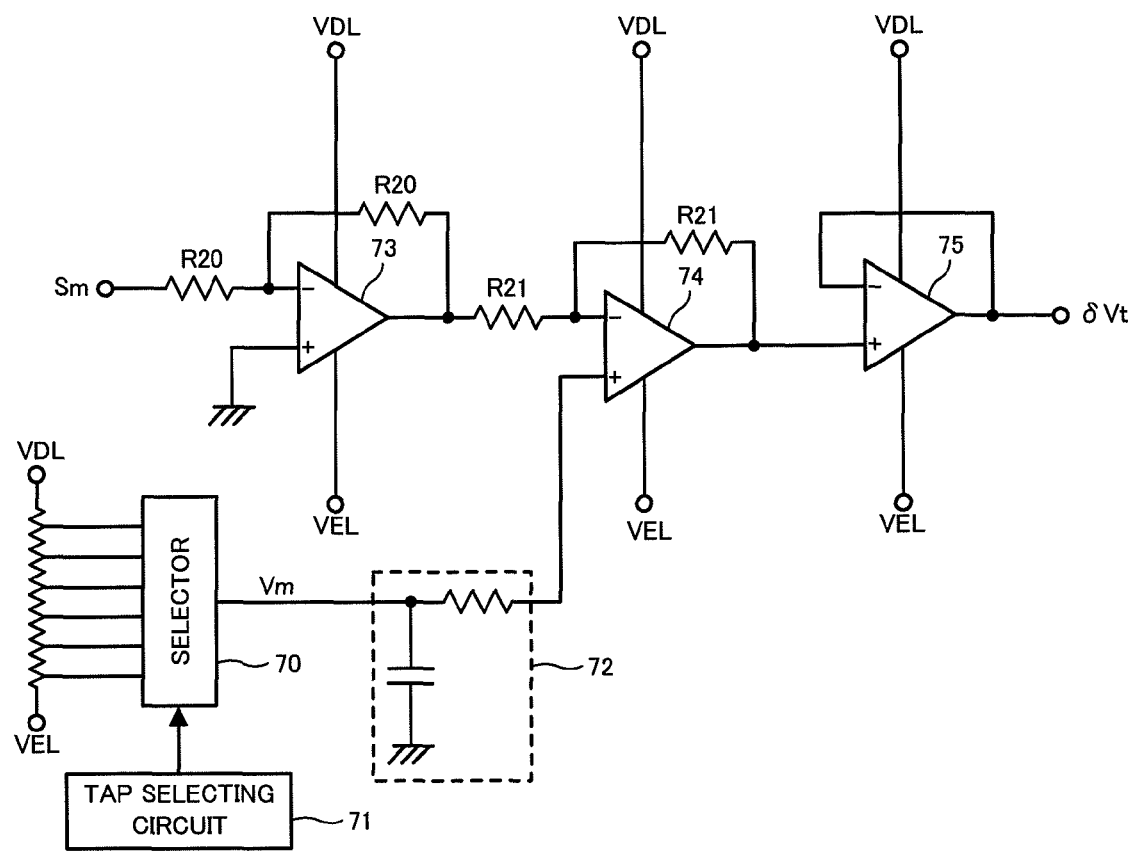
FIG. 19 is a diagram showing a circuit configuration example of a level correction part of FIG. 17.

FIG. 19 shows a circuit configuration example of the level correction part 51 of FIG. 17. As shown in FIG. 19, the level correction part 51 includes a selector 70, a tap selecting circuit 71, a low pass filter 72, and three operational amplifiers 73, 74 and 75. The selector 70 functioning as a correction amount setting circuit sets a desired voltage selected from a large number of intermediate voltages between the positive power supply voltage VDL and the negative power supply voltage VEL by resistive division based on correction amount information sent from the tap selecting circuit 71, and outputs a correction amount Vm. Selection of the intermediate voltages in the selector 70 is programmed in the tap selecting circuit 71. The correction amount Vm is set so that, for example, the correction signal δVt becomes 0V when the manufacturing process is "typ" and the temperature is 50 degrees. By setting the correction amount Vm in this manner, it is possible to obtain the correction signal δVt in which the fluctuation of the threshold voltage Vt2 of the MOS transistor Q2 due to the fluctuation of manufacturing process at the temperature of 50 degrees is compensated. In order to program the correction amount Vm, it is possible to utilize, for example, laser fuses, electrical fuses, a nonvolatile memory element, or a one-time programmable element.

The first operational amplifier 73 inverts and amplifies the monitor signal Sm of the threshold voltage monitor part 50, and outputs an inverted monitor signal −Sm. The second operational amplifier 74 receives the inverted monitor signal −Sm at a minus-side input terminal and receives the correction amount Vm smoothed through the low pass filter 72 composed of a resistor and a capacitor at a plus-side input terminal as s shifted voltage. When resistors R20 and R21 are arranged as shown in FIG. 19, a signal Sm+2Vm obtained by adding 2Vm to the signal Sm is outputted from the operational amplifier 74. The third operational amplifier 75 forms a voltage follower and outputs the correction signal δVt equal to Sm+2Vm.

Figure 20:
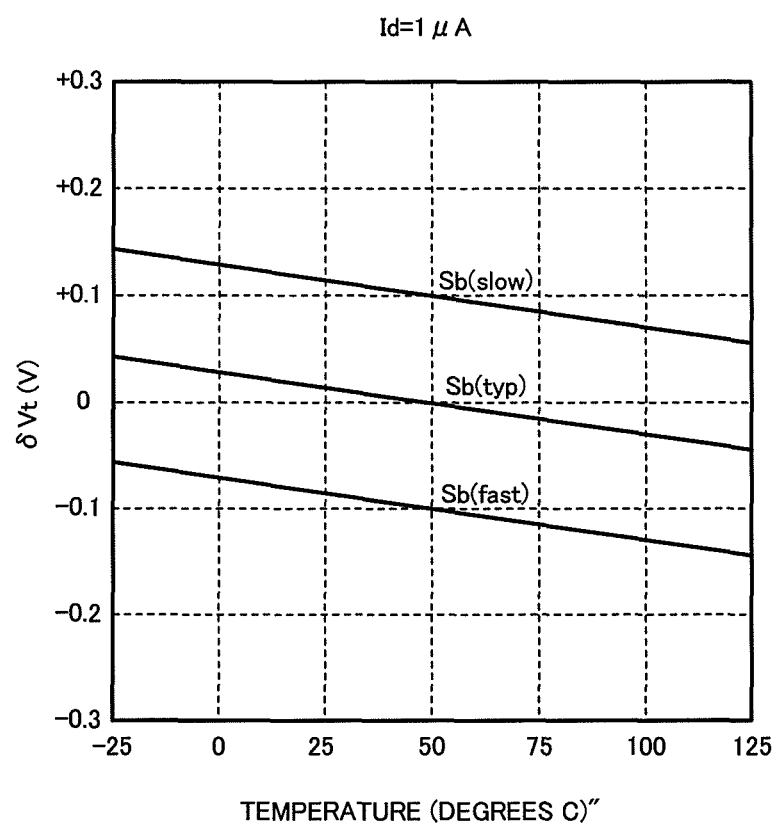
FIG. 20 is a graph showing an example of process/temperature dependency of a correction signal δVt outputted from the level correction part of FIG. 19.

FIG. 20 is a graph showing an example of process fluctuation and temperature dependency of the correction signal δVt outputted from the above level correction part 51. In FIG. 20, three operation characteristics Sb are shown in a graph in the same manner as in FIG. 16. Here, the current Ib2 of the constant current source 60 in FIG. 18 is desired to be set to a relatively large value, for example, 1 μA. This is because when driving the global bit line GBL to the ground VSS, a value of the current flowing in the MOS transistor Q2 is large to some extent and the current Ib2 needs to match this value.

Figure 21:
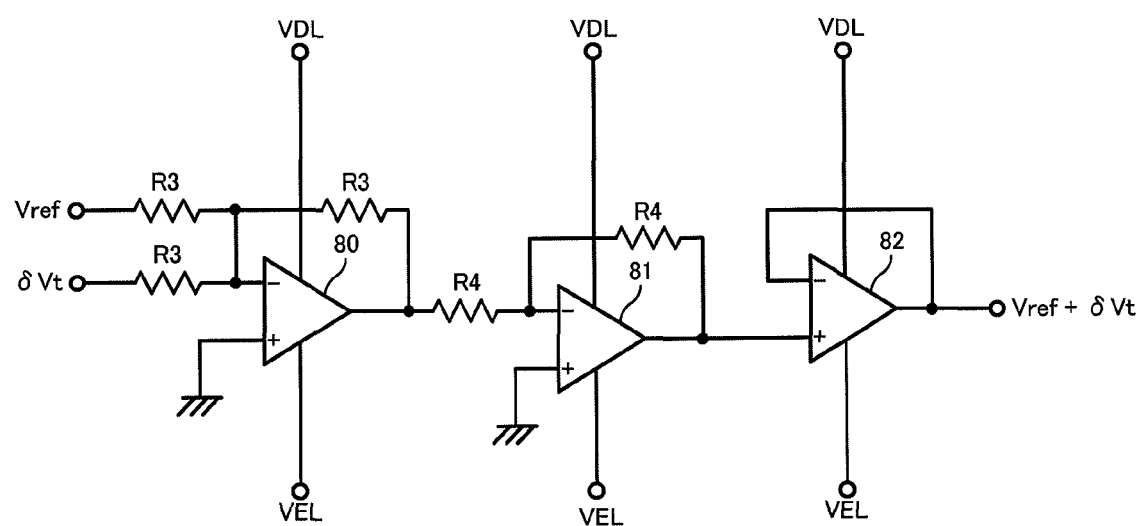
FIG. 21 is a diagram showing a circuit configuration example of a compensated voltage adding part of FIG. 17.

FIG. 21 shows a circuit configuration example of the compensated voltage adding part 52 of FIG. 17. As shown in FIG. 21, the compensated voltage adding part 52 includes three operational amplifiers 80, 81 and 82. The first operational amplifier 80 adds the reference voltage Vref and the correction signal δVt of the level correction part 51 and inverts and amplifies the added signal. The second operational amplifier 81 further inverts and amplifies the output of the operational amplifier 80 and generates a voltage Vref+δVt. The third operational amplifier 82 forms a voltage follower and outputs the voltage Vref+δVt. As described above, the voltages VSNH and VSNL, the cell plate voltage VPLT, the positive voltage VSET, and the predetermined voltage corresponding to the voltage Vb can be respectively used as the reference voltage Vref in FIG. 21. The value of the reference voltage Vref is set to, for example, 1.0V for the voltage VSNH and VSET, 0V for the voltage VSNL, and 0.5V for the cell plate voltage and the predetermined voltage corresponding to the voltage Vb. In these cases, assuming that the value of the correction signal δVt is 0±0.1V, a voltage obtained by adding a fluctuation component ±0.1V to the reference voltage Vref in each case can be generated and supplied to a target circuit.

As described above, the fluctuation of the threshold voltage Vt2 of the MOS transistor Q2 due to manufacturing process and temperature can be reflected to each power supply based on the operation of the threshold voltage monitor part 50. Thus, respective values of the voltages VSNH and VSNL, the cell plate voltage VPLT and the positive voltage VSET can be appropriately set so as to compensate the fluctuation of the threshold voltage Vt2 of the MOS transistor Q2. For example, the positive voltage VSET used to precharge the sense node Ns in the local sense amplifier 20 can be controlled to be increased following the increase of the threshold voltage Vt2 of the MOS transistor Q2, and reversely decreased following the decrease of the threshold voltage Vt2. Further, the voltage for writing data of high and low levels in the memory cell MC can be similarly controlled to be increased or decreased following a change in the threshold voltage Vt2 of the MOS transistor Q2. Furthermore, as to the voltages Vg1 and Vg2 for the gate voltage Vg, it is possible to control each voltage to be similarly increased or decreased following a change in threshold voltage Vt2 of the MOS transistor Q2. As a result, since each voltage in the sensing part changes in the same manner as the change in the threshold voltage Vt2 of the MOS transistor Q2, the actual variation can be reduced relative to the above-mentioned variation permissible range Rvt of the threshold voltage, thereby further improving the operating margin of the sense amplifier circuit and achieving higher-speed read operation.

Fourth Embodiment

Next, a fourth embodiment of the invention will be described. The fourth embodiment relates to the single-ended sense amplifier circuit controlled in the charge transfer mode and the charge distributing mode as in the first embodiment. However, the fourth embodiment employs a configuration different from that in the first embodiment. FIG. 22 shows a configuration example of a sensing part in a DRAM of the fourth embodiment, in which the memory cell MC, the preamplifier 10 and the sense latch circuit 11 are shown like in FIG. 3.

Since the configuration example of FIG. 22 is almost common to that of FIG. 3, only differences therebetween will be described below. The preamplifier 10 shown in FIG. 22 includes an N-type MOS transistor Q12 (the first precharge circuit of the invention) functioning as a transistor for precharging the bit line BL instead of the MOS transistor Q3 of FIG. 3. The precharge signal PC1 is applied to the gate of the MOS transistor Q12, and the MOS transistor Q12 precharges the bit line BL to the voltage Vb when the precharge signal PC is high. Further, the source of the MOS transistor Q6 is connected to the power supply voltage VDD instead of the positive voltage VSET.

Although in the above first embodiment, the bit line BL is driven to the voltage Vb by controlling the gate voltage Vg of the transistor Q1 to satisfy Vb=Vg–Vt1, the fourth embodiment has a feature of directly supplying the voltage Vb to the bit line BL via the MOS transistor Q12. A read operation based on the MOS transistor Q12 will be described in detail in a fifth embodiment below. In FIG. 22, the capacitance Ca is, for example, 1 to 2 fF, in the same manner as in the first embodiment, which is significantly lower than the bit line capacitance Cb.

In the fourth embodiment, the circuit configuration of the sense latch circuit 11 shown in FIG. 4 and the amplifying operation of the sense amplifier circuit shown in FIGS. 5A and 5B are common to those in the first embodiment, so description thereof will be omitted.

Fifth Embodiment

Figure 23:
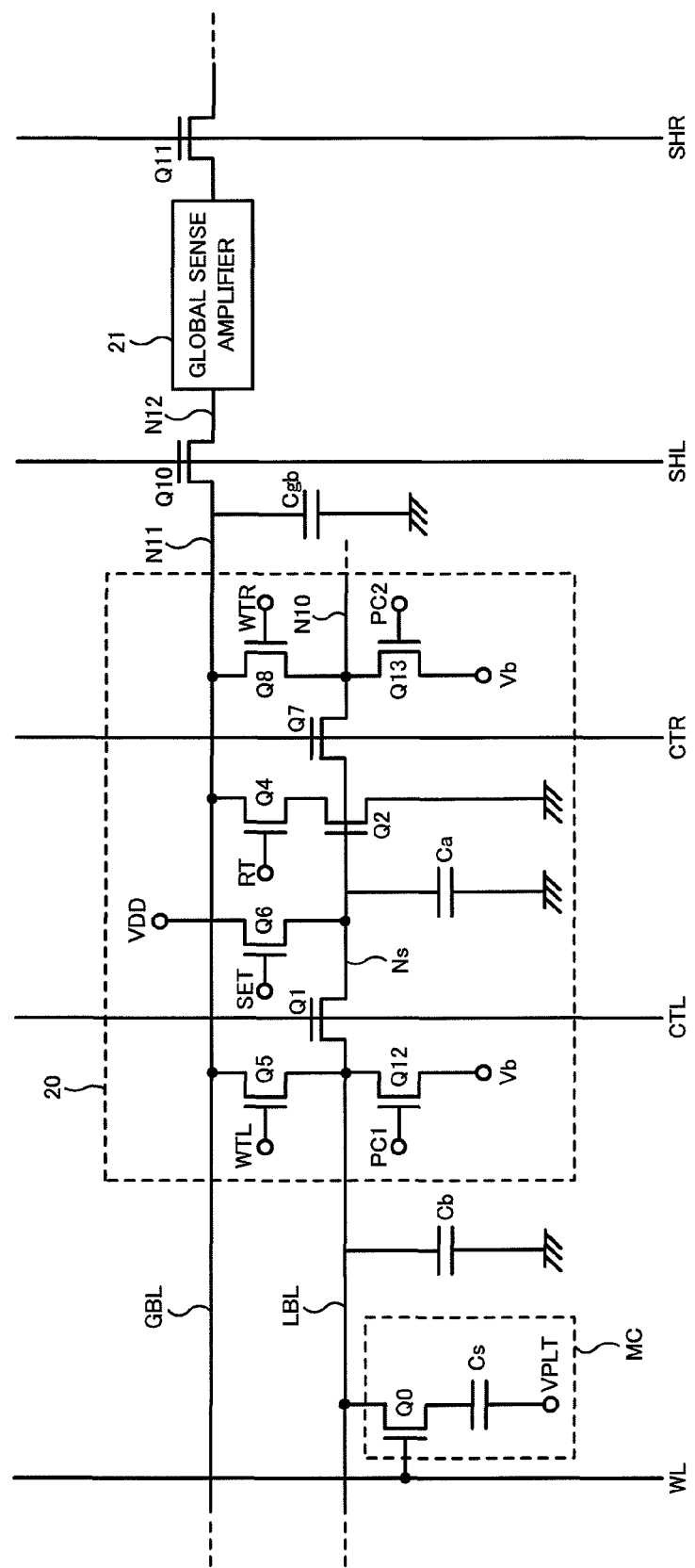
FIG. 23 is a diagram showing a configuration example of a sensing part in a DRAM of a fifth embodiment.

Next, a fifth embodiment of the invention will be described. In the fifth embodiment, the single-ended sense amplifier circuit of the fourth embodiment is applied to a DRAM in which a hierarchical memory cell array is formed and hierarchical bit lines and hierarchical sense amplifier circuits are provided. FIG. 23 shows a configuration example of a sensing part in the DRAM of the fifth embodiment, in which the memory cell MC, the local bit line LBL and the global bit line GBL, the local sense amplifier 20 and the global sense amplifier 21 are shown.

Since the configuration example of FIG. 23 is almost common to that of FIG. 8, only differences therebetween will be described below. The local sense amplifier 20 shown in FIG. 23 includes two N-type MOS transistors Q12 and Q13 instead of the MOS transistors Q3 and Q9 of FIG. 8. The transistor Q12 of the left side functions as a transistor for precharging one local bit line LBL, and the transistor Q13 of the right side functions as a transistor for precharging the other local bit line LBL (node N10). The source of the MOS transistor Q6 is connected to the power supply voltage VDD. Further, the precharge signal PC1 is applied to the gate of the MOS transistor Q12 of the left side, and the precharge signal PC2 is applied to the gate of the MOS transistor Q13 of the right side. The local bit lines LBL on the both sides can be selectively precharged to the voltage Vb by individually controlling the precharge signals PC1 and PC2.

In the fifth embodiment, the circuit configuration of the global sense amplifier 21 shown in FIG. 9 and the two graphs for explaining the amplifying operation of the sense amplifier circuit shown in FIGS. 10A and 10B are common to those in the second embodiment, so description thereof will be omitted.

Figure 24:
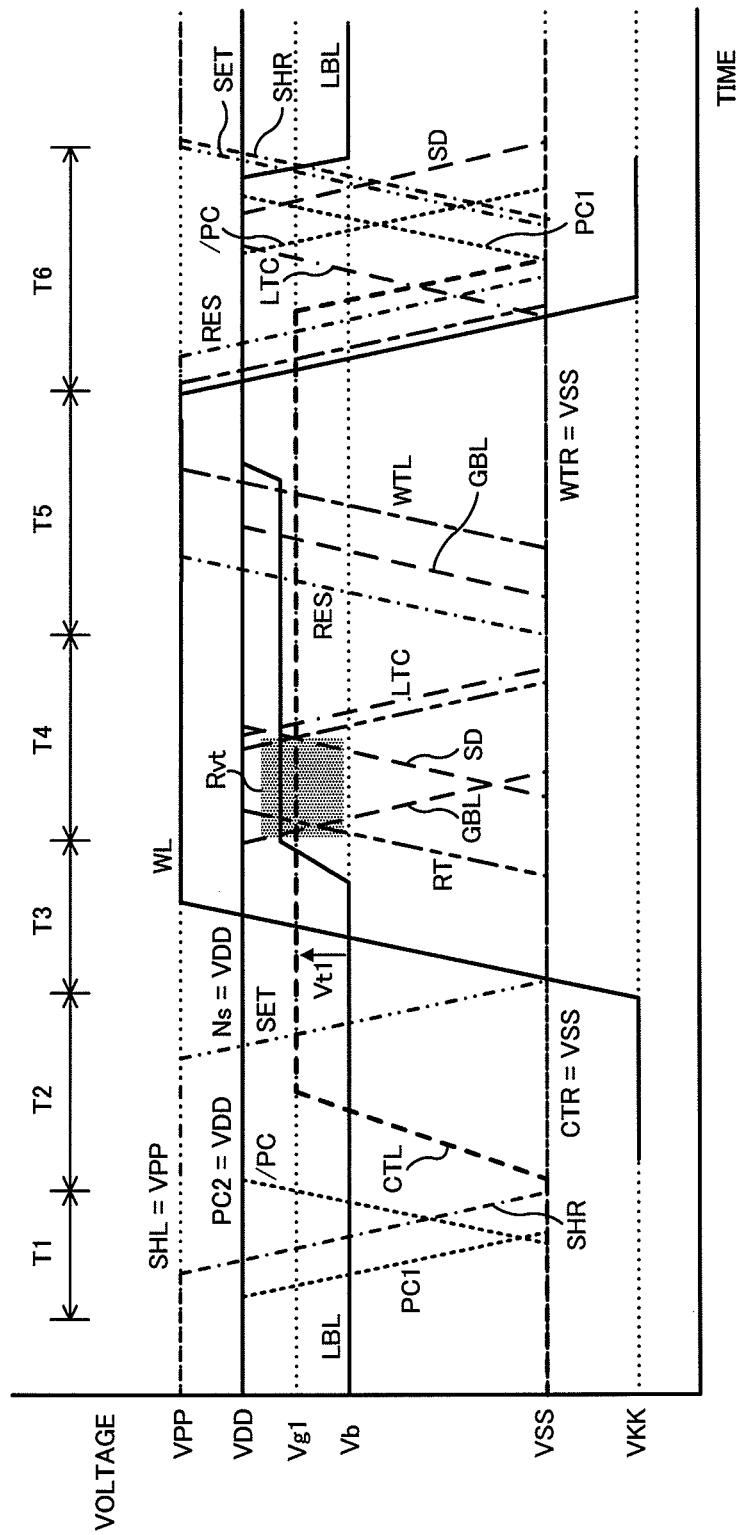
FIG. 24 is a diagram for explaining a read operation in the DRAM of the fifth embodiment and showing operation waveforms in a case of reading high-level data from a memory cell.
Figure 25:
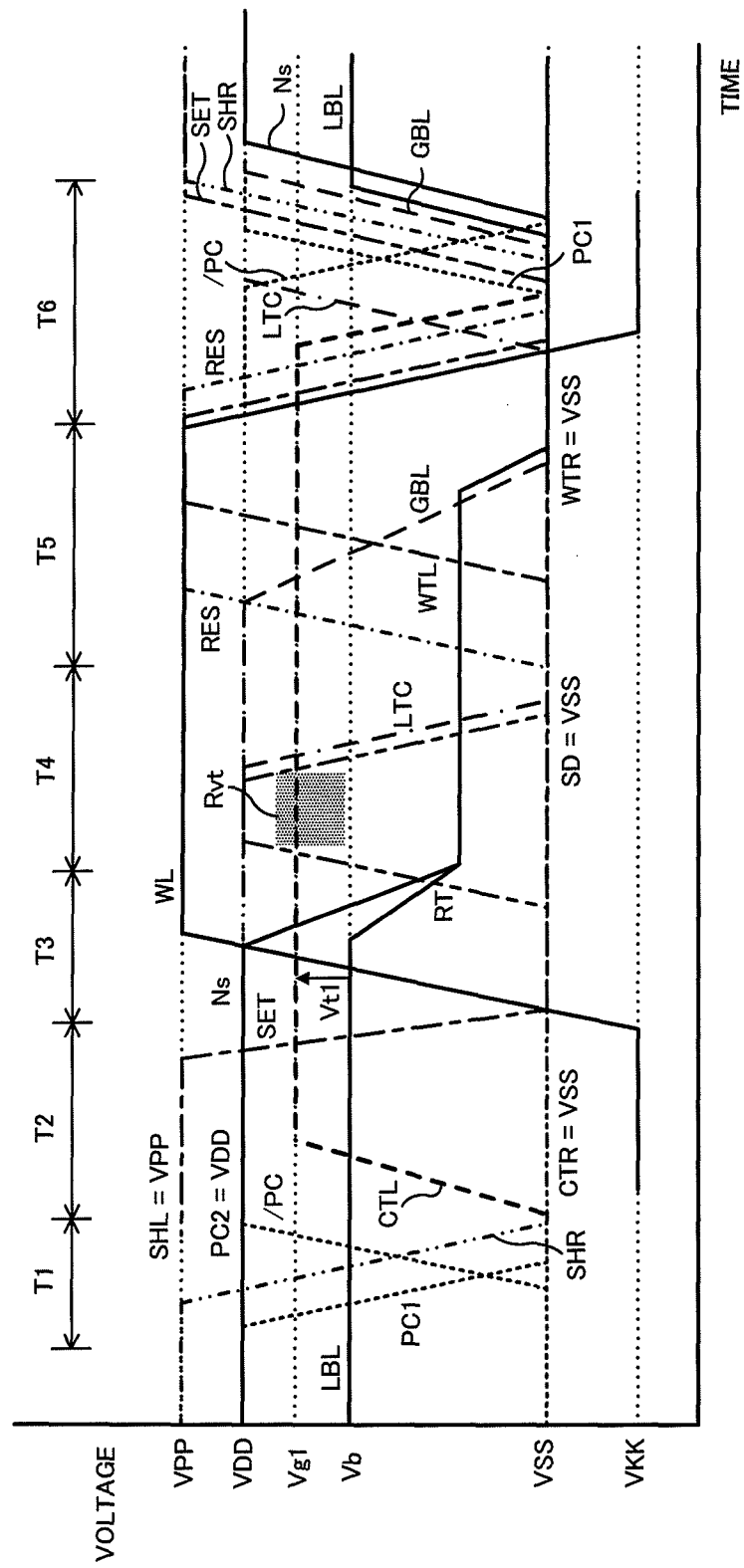
FIG. 25 is a diagram for explaining a read operation in the DRAM of the fifth embodiment and showing operation waveforms in a case of reading low-level data from the memory cell.

Next, a read operation in the DRAM of the fifth embodiment will be described with reference to FIGS. 24 and 25. FIG. 24 shows operation waveforms in a case of reading high-level data from the memory cell MC, and FIG. 25 shows operation waveforms in a case of reading low-level data from the memory cell MC. Here, the entire operation is divided into six terms (T1 to T6) in the same manner as in the second embodiment (FIGS. 11 and 12).

In the read operation of the high-level data as shown in FIG. 24, just before the precharge cancellation term T1, the local bit line LBL has been precharged to the voltage Vb, the sense node Ns has been precharged to the power supply voltage VDD and the global bit line GBL has been precharged to the power supply voltage VDD. At this point, the precharge signals PC1, PC2, the control signals SET, SHL, SHR, and the latch control signal LTC are respectively at the high-level and the inverted precharge signal /PC, the control signals CTL, CTR, WTL, WTR and RT are respectively at the low-level.

In the precharge cancellation term T1, the precharge signal PCL is controlled to be low so that the MOS transistor Q12 is turned off, and the local bit line LBL is precharged to the voltage Vb and becomes floating. The inverted precharge signal /PC is controlled to be high so that the MOS transistor Q20 is turned off, and the global bit line GBL is maintained in a state of being precharged to the power supply voltage VDD. Further, the control signal SHR is controlled to be low, and the non-selected global bit line GBL is disconnected from the global sense amplifier 21. In addition, the non-selected local sense amplifier 20 is maintained in a state where the precharge signals PC1, PC2 and the control signal SET are at the high-level and the control signals CTL, CTR, WTL, WTR and RT are at the low-level.

In a charge transfer gate voltage set term T2, the control signal CTL is controlled to be the voltage Vg1 satisfying Vg1=Vb+Vt1. Thereafter, the control voltage SET is controlled to be low, and the sense node Ns is precharged to the power supply voltage VDD and becomes floating.

In the fifth embodiment as described above, the overdriving of the gate voltage Vg of the MOS transistor Q1 as in the second embodiment is not performed. On the other hand, the local bit line LBL is previously set to the voltage Vb via the MOS transistor Q12 receiving the control signal CTL. Therefore, a time required for changing the potential of the local bit line LBL from the grand potential VSS to the voltage Vb can be unnecessary, which is effective for reducing the operating time.

In the cell selection term T3, the word line WL is driven from the negative voltage VKK to the positive voltage VPP. Thereby, a signal voltage of the memory cell MC maintaining high level is read out to the local bit line LBL. At this point, since the voltage Vb of the local bit line LBL is higher than the voltage Vg1-Vt1, the MOS transistor Q1 is maintained off. Thus, the sense node Ns is maintained in a state of being precharged to the power supply voltage VDD.

Waveforms in the subsequent sense term T4 and restore term T5 are common to those in FIG. 11 of the second embodiment, so description thereof will be omitted.

In a precharge term T6, the word line WL is returned to the negative voltage VKK. Subsequently, the control signals WTL, RES and CTL are controlled to be low, and the latch control signal LTC is controlled to be high. Subsequently, the precharge signal PC1 and the control signal SET are controlled to be high, the inverted precharge signal /PC is controlled to be low, the local bit line LBL is precharged to the voltage Vb, and both the sense node Ns and the global bit line GBL are precharged to the power supply voltage VDD. Thereby, the output signal SD of the signal voltage decision latch 21a changes to low. Finally, the control signal SHR is controlled to be the positive voltage VPP, and the read operation is completed.

Next, in the read operation of the low-level data as shown in FIG. 25, the operation before the end of the charge transfer gate voltage set term T2 is performed in the same manner as in FIG. 24. In the subsequent cell selection term T3, the word line WL is driven from the negative voltage VKK to the positive voltage VPP, and a signal voltage of the memory cell MC maintaining low level is read out to the local bit line LBL. At this point, the voltage Vb of the local bit line LBL and the voltage Va of the sense node Ns change in the manner as described in FIG. 12 of the second embodiment. Also waveforms in the subsequent sense term T4 and the restore term T5 are common to those in FIG. 12 of the second embodiment, so description thereof will be omitted.

In the precharge term T6, the word line WL, the control signals WTL, RES and SET, the latch control signal LTC, the precharge signal PC1, and the inverted precharge signal /PC are controlled in the same manner as in FIG. 24. At this point, the local bit line LBL, the sense node Ns and the global bit line GBL are respectively precharged, each of which returns to an initial state. Finally, the control signal SHR is controlled to be the positive voltage VPP, and the read operation is completed.

Here, the operation waveforms shown in FIGS. 24 and 25 are applied to the read operation of the fifth embodiment, and also substantially the same operation waveforms can be applied to the fourth embodiment. In this case, the local bit line LBL may be replaced with the bit line BL, the global bit line GBL may be replaced with the input/output node N1, the control signal CTL may be replaced with the gate voltage Vg, and the control signals CTR, WTR, SHR and the precharge signal PC2 may be neglected.

Figure 26:
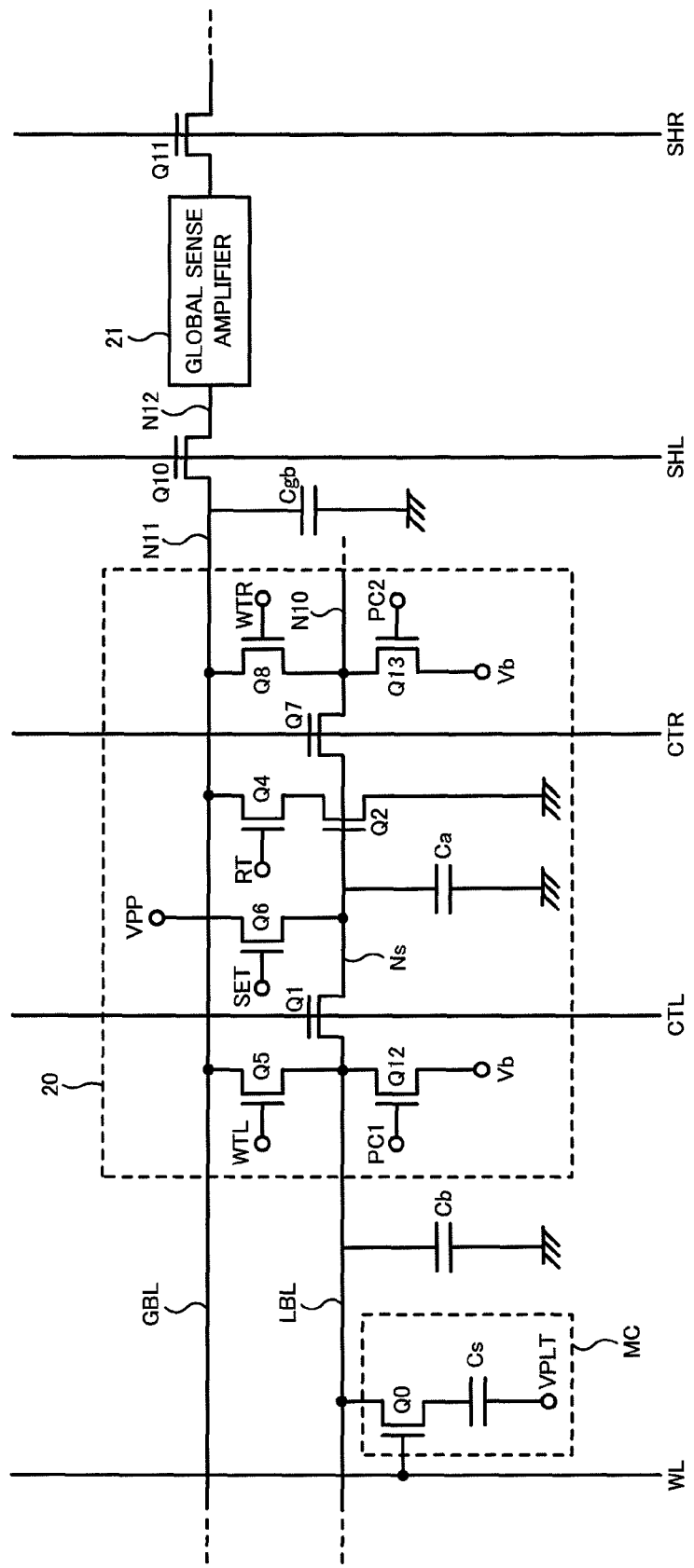
FIG. 26 is a diagram showing an example of a circuit configuration of a local sense amplifier in a modification of the fifth embodiment.

Next, a modification of the fifth embodiment will be described. FIG. 26 shows a configuration as the modification of the fifth embodiment, in which part of the local sense amplifier 20 is modified. That is, in FIG. 26, the drain of the MOS transistor Q6 in the local sense amplifier 20 is connected to the positive voltage VPP in the same configuration as in FIG. 23. Thereby, the potential of the sense node Ns is precharged to a voltage lower than the positive voltage VPP by a threshold voltage Vt6 of the MOS transistor Q6. This voltage is higher than the power supply voltage VDD, and set to, for example, 1.5V. In addition, other circuit portions in FIG. 26 are common to those in FIG. 23, so description thereof will be omitted.

Figure 27:
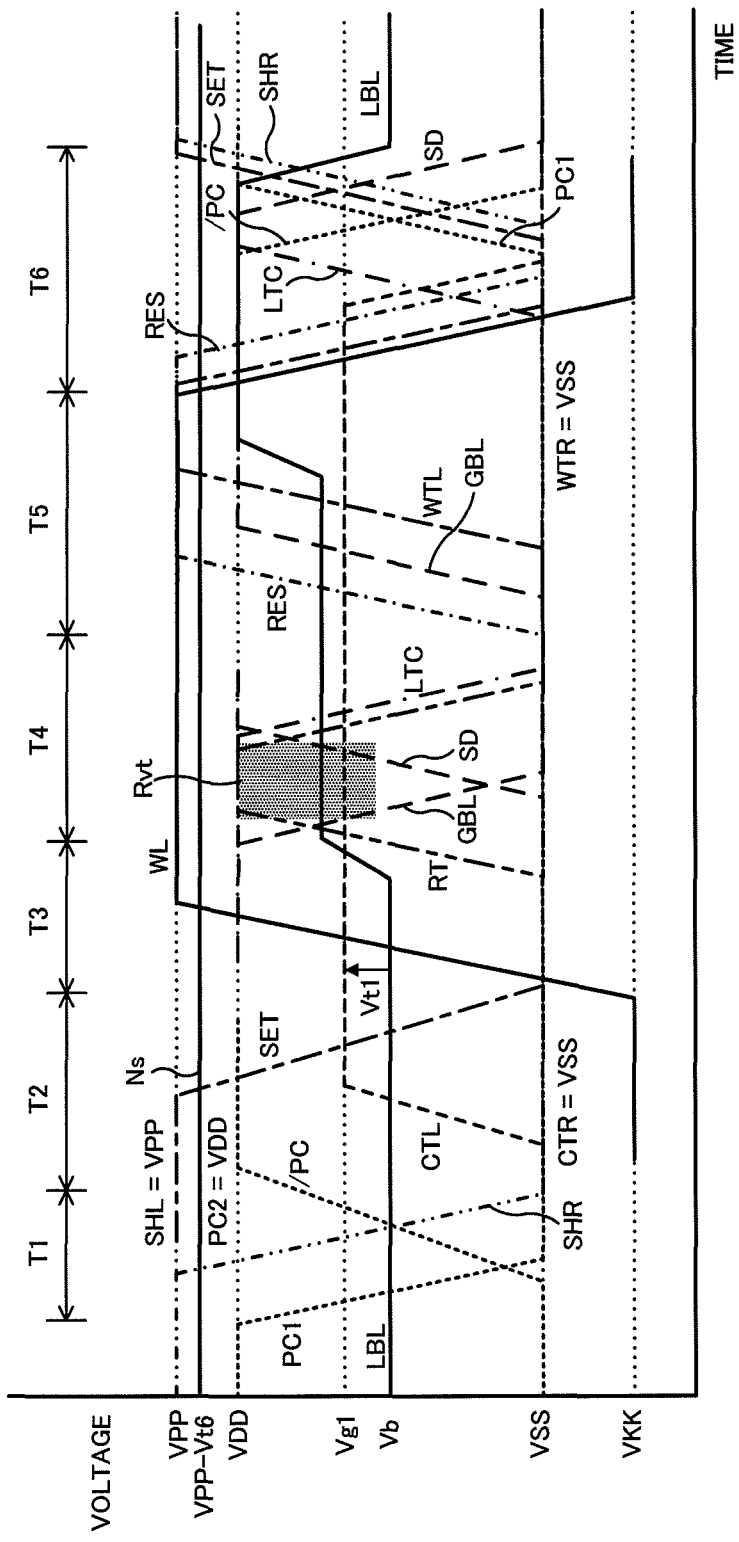
FIG. 27 is a diagram for explaining a read operation in FIG. 26 and showing operation waveforms in a case of reading high-level data from a memory cell.
Figure 28:
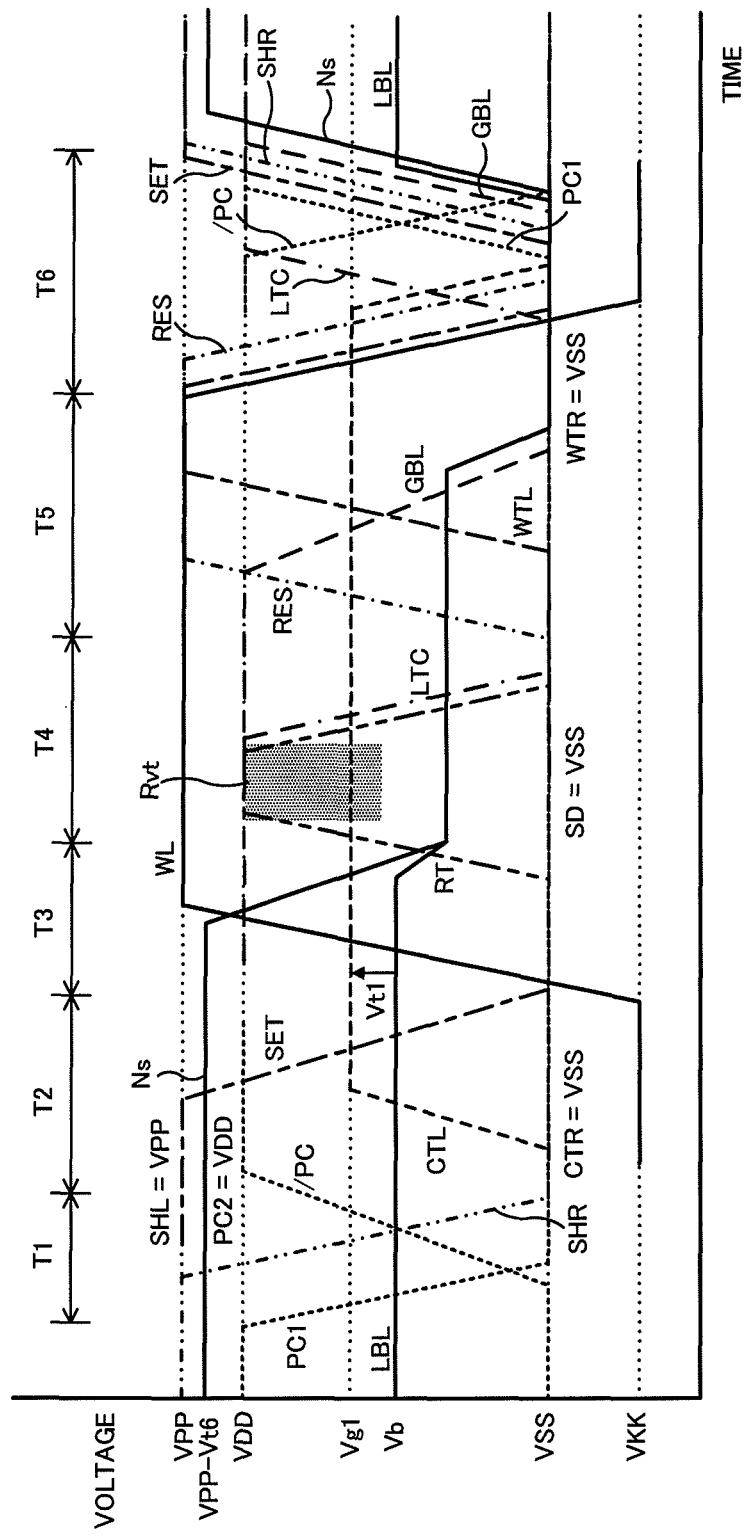
FIG. 28 is a diagram for explaining a read operation in FIG. 26 and showing operation waveforms in a case of reading low-level data from a memory cell.

FIGS. 27 and 28 are diagrams explaining a read operation in the DRAM of this modification, and show operation waveforms corresponding to FIGS. 24 and 25. Since many of the operation waveforms in FIGS. 27 and 28 are common to those in FIGS. 24 and 25, only differences therebetween will be described below. In this modification, the sense node Ns is driven to the positive voltage VPP, and thus the potential of the sense node Ns is in a state of being precharged to a relatively high voltage of VPP-Vt6 (for example 1.5V) and becomes floating. Thereby, as shown in FIGS. 27 and 28, the potential of the sense node Ns increases, and an effect of expanding the variation permissible range Rvt of the threshold voltage Vt2.

Sixth Embodiment

Next, a sixth embodiment of the invention will be described. In a DRAM of the sixth embodiment, the compensated voltage generating circuit, which has been described in the third embodiment, is applied to the configuration of the fifth embodiment. FIGS. 13, 14 and 16 to 21 of the third embodiment can be applied to the sixth embodiment. In contrast, FIG. 15 of the third embodiment is not applied to the sixth embodiment because this indicates the configuration related to generation of the voltage Vg2 used for overdriving. Specific configuration and effect in the six embodiment are the same as those described in the third embodiment, so description thereof will be omitted.

In the foregoing, although the contents of the invention have been specifically described based on the embodiments, the invention is not limited the above-described embodiments, and can variously be modified without departing the essentials of the invention. For example, the above embodiments have described the preamplifier 10 and the local sense amplifier 20 (the sense amplifier circuit) each including six MOS transistors. However, the invention can be widely applied to various sense amplifier circuits having the first MOS transistor functioning as the charge transfer gate, the second MOS transistor amplifying the signal voltage via the first MOS transistor, the first precharge circuit for the bit line and the second precharge circuit for the sense node, without restriction for other components.

Further, the present invention is not limited to the DRAM, and can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like.

The invention claimed is:

1. A method for reading data in a dynamic random access memory comprising the steps of:
   precharging a bit line to a first potential;
   precharging a sense node to a second potential higher than the first potential;
   controlling a gate of a charge transfer transistor connected between the bit line and the sense node to a third potential higher than the first potential;
   driving a word line to turn on a memory cell selection transistor to connect a memory cell capacitor to the bit line;
   transferring charge from the sense node to the bit line by charge transfer mode; and
   distributing charge between the sense node and the bit line by charge distributing mode.

2. The method as claimed in claim 1, wherein the third potential is equal to the first potential plus the threshold voltage of the charge transfer transistor.

3. The method as claimed in claim 2, wherein the bit line is precharged to the first potential through the charge transfer transistor while the sense node is being precharged to the second potential.

4. The method as claimed in claim 1, wherein the second potential is a power supply voltage (VDD).

5. The method as claimed in claim 1, further comprising the step of precharging the bit line to a fourth potential lower than the first potential before precharging the bit line to the first potential.

6. The method as claimed in claim 5, wherein the fourth potential is ground.

7. The method as claimed in claim 1, wherein the gate of the charge transfer transistor is held at the third potential.

8. The method as claimed in claim 1, wherein controlling the gate of the charge transfer transistor comprises driving the gate of the charge transfer transistor from a ground potential to the third potential.

9. The method as claimed in claim 1, wherein controlling the gate of the charge transfer transistor comprises overdriving the gate of the charge transfer transistor from a ground potential to a fourth potential higher than the third potential and subsequently driving the gate of the charge transfer transistor to the third potential.

10. The method as claimed in claim 1, wherein charge is transferred from the sense node to the bit line until the sense node and the bit line reach a common voltage.

* * * * *